United States Patent
Dulger et al.

(10) Patent No.: US 7,983,375 B2
(45) Date of Patent: Jul. 19, 2011

(54) VARIABLE DELAY OSCILLATOR BUFFER

(75) Inventors: Fikret Dulger, Plano, TX (US); Robert B. Staszewski, Garland, TX (US); Francis P. Cruise, Dallas, TX (US); Gennady Feygin, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 821 days.

(21) Appl. No.: 12/021,205

(22) Filed: Jan. 28, 2008

(65) Prior Publication Data

US 2008/0192876 A1 Aug. 14, 2008

Related U.S. Application Data

(60) Provisional application No. 60/889,334, filed on Feb. 12, 2007.

(51) Int. Cl.
*H03D 3/24* (2006.01)
(52) U.S. Cl. ........................................ 375/376
(58) Field of Classification Search .................. 375/375, 375/376, 372
See application file for complete search history.

(56) References Cited

U.S. PATENT DOCUMENTS

| | | | |
|---|---|---|---|
| 6,809,598 | B1 | 10/2004 | Staszewski et al. |
| 2006/0033582 | A1 | 2/2006 | Staszewski et al. |
| 2006/0038710 | A1 | 2/2006 | Staszewski et al. |
| 2006/0208779 | A1 * | 9/2006 | Lin et al. ............. 327/158 |
| 2006/0226881 | A1 * | 10/2006 | Jaussi et al. .......... 327/158 |

OTHER PUBLICATIONS

U.S. Appl. No. 11/853,182, filed Sep. 2007, Sheba et al.
U.S. Appl. No. 11/832,292, filed Aug. 2007, Entezari et al.

* cited by examiner

*Primary Examiner* — Chieh M Fan
*Assistant Examiner* — Jaison Joseph
(74) *Attorney, Agent, or Firm* — John R. Pessetto; W. James Brady; Frederick J. Telecky, Jr.

(57) ABSTRACT

A novel and useful variable delay digitally controlled crystal oscillator (DCXO) buffer (i.e. slicer). A conventional slicer following the DCXO is modified to introduce a controlled random variable delay into the buffered DCXO clock. The resultant output clock signal is then used as input to the TDC of an ADPLL circuit to alleviate the subharmonic mixing based deterioration caused by LO/TX coupling through the crystal pins, and to alleviate the dead-beat effects caused by the finite resolution of the TDC. Two mechanisms for introducing variable delay into the buffered DCXO output clock signal are presented: a first mechanism that creates variable delay in fine steps and a second mechanism that creates variable delay in coarse steps. In both mechanisms, switches are incorporated into the slicer circuitry and controlled using digital bit sequences which may comprise dithering signals. The switches are turned on and off via the digital bit sequences which varies the delay of the slicer clock output which serves to shift the rising and falling transition points of the resultant output clock signal. The jitter is shifted to higher frequencies where it is filtered out by the PLL loop filter.

16 Claims, 20 Drawing Sheets

VARIABLE DELAY OSCILLATOR BUFFER

REFERENCE TO PRIORITY APPLICATION

This application claims priority to U.S. Provisional Application Ser. No. 60/889,334, filed Feb. 12, 2007, entitled "Dithering of Frequency Reference Through Bond Wires", incorporated herein by reference in its entirety.

FIELD OF THE INVENTION

The present invention relates to the field of data communications and more particularly relates to an oscillator buffer, i.e. Digitally Controlled Crystal Oscillator (DCXO) buffer or slicer, that generates an output clock signal having a variable delay.

BACKGROUND OF THE INVENTION

A current trend in modern radio design is the attempt to continually increase the level of integration. A problem arises, however, in that the required die area increases as more and more functions are integrated into single chip radio designs. An example is the DRP based cellular phones which incorporate other radios in addition to the basic cellular radio, including Bluetooth, GPS, FM, etc. As more and more functions are added, interference between the various radios (which run at different frequencies) is becoming more and more of a problem. As physical distances decrease between radios and IC pins get closer to each other frequency planning is becoming more difficult on system on chip (SoC) designs. For example, the physical distance between the digitally-controlled crystal oscillator (DCXO) pin and the transmit RF output is becoming smaller and thus is more susceptible to interference caused by the RF output signal being coupled into the reference frequency input which should be the purest signal in the circuit. This contaminated signal then passes through a slicer (a very nonlinear circuit which creates harmonics). At certain harmonics (i.e., integer ratio of output RF signal to reference signal), subharmonic mixing of the RF output signal with the reference frequency signal occurs in the slicer. A portion of the mixing products are close to DC which is likely to be within the bandwidth of the PLL thus degrading its performance and impacting the quality of the RF output signal. The RF output signal coupled back to the DCXO manifests itself as jitter in the reference frequency, i.e., modulation of the zero crossings of the frequency reference signal which, for integer or near-integer ratios of RF output (normally modulated) and reference frequency, is within the loop bandwidth resulting in degraded phase error.

A diagram illustrating a first example prior art single chip polar transceiver radio showing a transmitter incorporating an all-digital phase-locked loop (ADPLL)-based transmitter circuits, as well as potential parasitic coupling paths is shown in FIG. 1. The single chip radio, generally referenced 10, comprises an ADPLL circuit 16, pulse shaping filter 12, amplitude modulation (AM) circuit 14, digital RF to amplitude converter (DRAC) 18 (also referred to as a Digitally Controlled Power Amplifier or DPA) which consists of a Pre Power Amplifier (PPA) and Sigma-Delta Amplitude Modulator (SAM), digitally controlled crystal oscillator (DCXO) 20 and slicer 25. The ADPLL 16 comprises modulating FCW adder 11, reference phase accumulator 15, time to digital converter (TDC) 13, subtracter/adder 17, loop filter 21, modulating adder 23, DCO Gain Multiplier 9 and digitally controlled oscillator (DCO) 27.

The radio implements a direct FM or polar transmitter whereby the ADPLL generates an output frequency in accordance with a frequency control word (FCW) input. The CKV clock signal output of the ADPLL is amplitude modulated in accordance with an amplitude control word (ACW) generated by the AM circuit 14.

Depending on the particular implementation of the radio, a potential problem that may occur is excessive RMS phase error, or phase/frequency modulation distortion in general, for "integer-N channels" of transmission. The integer-N channels are those for which the ratio between the carrier frequency produced by the ADPLL is an integer multiple of the input reference frequency FREF. In a highly integrated multi-band cellular radio with its reference clock generating Digitally-Controlled Crystal Oscillator (DCXO) also being integrated in the same die, a significant performance degrading phenomenon is the coupling of the RF transmit output signal through the crystal pins or the buffer of the DCXO.

Thus, the RMS phase error problem is due to the RF output or internal RF (e.g., digital RF) signal coupling back into the DCXO or its buffer that provides the frequency reference signal for the local oscillator based on the ADPLL. The much higher frequency RF output signal that is generated is coupled into the much lower frequency FREF input, where a slicer exists to convert the oscillations into a two-level clock signal. The slicer performs a non-linear operation which allows the additive interference to translate into additive phase (or jitter) on the clock produced by this circuit. It is noted that this problem can arise in any type of PLL or frequency synthesizer circuit, where the output RF signal has the opportunity of coupling into the FREF circuitry, as typically is the case in a system-on-chip (SoC) environment.

The coupling mechanism is modeled in FIG. 1 as a modulus CKV/FREF block 26 coupled to a gain block 24. This interference signal is coupled to the FREF signal via virtual adder 22 before it enters the slicer 25. Thus, the frequency reference signal output of the slicer contains this interference signal. Thus, the ADPLL output, derived signals or the RF output signal is effectively coupled (various paths are indicated by dotted lines 28 and 29) from the output of the transmitter back to the frequency reference input. This coupling creates subharmonic mixing in the slicer (i.e. the buffer circuit following the DCXO core) through its nonlinear devices. The in-band spurs contaminated with the modulated TX signal generated through this mixing phenomenon pass through the ADPLL, being within the loop bandwidth, and degrade the phase error performance of the transmitter.

The RF interference at the DCXO is detrimental to the performance of the radio at integer-N channels because it gets downconverted to zero (due to being located at an integer multiple of the frequency reference), where it creates slow jitter on the frequency reference output of the slicer, via the AM/PM occurring in the slicer. The slow jitter passes through the low-pass frequency response of the PLL and reaches the output, thereby distorting the modulation (e.g., degrading the phase-trajectory error in GSM).

In highly integrated small silicon area radios, such as multi-band cellular radios with integrated RF and digital baseband (DBB), with very short separation between the RF and FREF bond pads, bond wires, balls and pins, this problem is practically unavoidable.

A block diagram illustrating an example prior art conventional single chip radio transceiver incorporating an on-chip DCXO buffer and showing a potential parasitic coupling path is shown in FIG. 2. Note that for clarity, only the transmitter and related phase locked loop's portions of the radio are shown. The circuit shown illustrates the source of the interference phenomena in a generic transmitter that utilizes an offset-PLL up-conversion modulation loop, widely used in GSM transceivers.

The transmitter part of the radio, generally referenced 130, comprises a DCXO 158 coupled to a crystal 154, slicer 160, IF PLL 162, RF PLL 164, offset mixer 148, low pass filter (LPF) 152, 90 degree phase shift 166, I mixer 132, Q mixer 134, summer 136, phase/frequency detector (PFD) 138, low pass loop filter 140, voltage controlled oscillator (VCO) 142 and pre-power amplifier (PPA) 144.

Consider the I/Q based transmitter a part of an integrated multi-band cellular radio with an on-chip DCXO coupled to the external crystal 154 at pin 156. The local oscillator (LO) signal or transmit RF output signal at pin 146 is coupled through the crystal pins back to the input of the DCXO, as indicated by dotted line 150. The coupling path may be via on-chip pathways, off-chip pathways (i.e. bond wires, pins, PCB wiring, etc.) or any combination thereof.

As in the radio of FIG. 1, this coupling creates sub-harmonic mixing in the slicer (i.e. the DCXO buffer) through the nonlinear devices making up the slicer. This results in in-band frequency spurs contaminated with modulated TX RF output signal which pass though the PLL resulting in degraded TX phase error performance.

Aside from the interference problem described above, an additional problem in an ADPLL based transmitter such as the one shown in FIG. 1 arises due to the finite resolution of the TDC (approximately 20 picoseconds, i.e. an inverter delay) which creates dead-beat effects at certain channels (i.e. integer-N and neighboring frequencies). This also degrades the modulation quality of the transmitter.

There have been prior art attempts to solve the above described problems. One such solution is described in U.S. application Ser. No. 11/853,182, filed Sep. 11, 2007, entitled "Adaptive Spectral Noise Shaping To Improve Time To Digital Converter Quantization Resolution Using Dithering," incorporated herein by reference in its entirety. In this solution, the circuitry of the TDC was modified to perform a reference frequency (FREF) clock delay shift through digital control of a capacitive load. A disadvantage of this approach, however, is that it created excessive transition times (e.g., more than 300 picoseconds), which created increased sensitivity to noise pickup by tying the delay generation through the degradation in the transition time. It is advantageous to have fast transition edges in order to minimize the duration in the metastable region between the legal logic levels to minimize noise pick-up.

Another prior art solution is described in U.S. application Ser. No. 11/832,292, filed Aug. 1, 2007, entitled "Minimization Of RMS Phase Error In A Phase Locked Loop By Dithering Of A Frequency Reference," incorporated herein by reference in its entirety. In this solution, magnetic coupling through the chip bond wires is used to introduce intentional dithering to the DCXO input. This approach, however, is not well controllable in both the amplitude and frequency location. It represents a more "brute force" approach which radiates the dithering energy into other circuits which is likely to cause one or more other unintended consequences.

There is thus a need for a mechanism that addresses these two problems and that is capable of (1) mitigating or eliminating the effects of the interference caused by coupling of the transmit RF output signal, or internal signals derived from the DCO, back into the frequency reference input to the ADPLL based local oscillator in a controllable manner, (2) overcoming continued scaling of problem as more coupling is inevitable as radio integration and scaling advance, and (3) permitting the increased use of digitization in radio design (such as the use of a TDC in place of a traditional charge-pump phase/frequency detector).

SUMMARY OF THE INVENTION

The present invention is a novel and useful variable delay digitally controlled crystal oscillator (DCXO) buffer also referred to as a slicer. The circuit of the present invention comprises a slicer circuit following the DCXO adapted to introduce a controlled variable delay into the buffered DCXO clock. The resultant output clock signal is then used as input to the TDC of an ADPLL circuit to alleviate the subharmonic mixing based deterioration caused by LO/TX coupling through the crystal pins.

The circuit of the present invention comprises two mechanisms for introducing variable delay into the buffered DCXO output clock signal: a first mechanism that creates variable delay in fine steps and a second mechanism that creates variable delay in coarse steps. In both mechanisms, switches are incorporated into the slicer circuitry which are controlled using digital bit sequences which may comprise dithering signals. In the case of dithering signals, the digital bit sequences are generated using any suitable well-known sigma-delta modulation technique.

The switches are turned on and off via the digital bit sequences which varies the delay of the slicer clock output. Dithering is performed on the bit sequences which control the switches that are used in variable delay generation. Note that for the sake of clarity in explanation, variable delay generation in fine steps is referred to as "fine dithering" and variable delay generation in coarse steps is referred to as "coarse dithering".

The invention is applicable to single chip radios with high levels of integration such as multi-band cellular radios that integrate the RF circuitry with the digital base band (DBB) circuitry on the same die or on close proximity thereto so as to exhibit interference from the transmit RF output signal coupling back into the frequency reference input. In a single chip radio, the reference frequency circuit area with its associated bond pads, bond wires, etc. is very close to the VCO and RF output buffers and their associated bond pads and wires.

Advantages of the variable delay slicer mechanism include (1) the application of dithering to the frequency reference (FREF) through controllable signal delay means without an accompanying degradation of the transition time of the output signal and thereby not increasing the sensitivity of the circuit to noise pickup; (2) the application of dithering to the frequency reference without affecting other circuits and other aspects of DCXO generation of the frequency reference; and (3) combining both coarse and fine dithering capability in a single circuit.

Note that some aspects of the invention described herein may be constructed as software objects that are executed in embedded devices as firmware, software objects that are executed as part of a software application on either an embedded or non-embedded computer system such as a digital signal processor (DSP), microcomputer, minicomputer, microprocessor, etc. running a real-time operating system such as WinCE, Symbian, OSE, Embedded LINUX, etc. or non-real time operating system such as Windows, UNIX, LINUX, etc., or as soft core realized HDL circuits embodied in an Application. Specific Integrated Circuit (ASIC) or Field Programmable Gate Array (FPGA), or as functionally equivalent discrete hardware components.

There is thus provided in accordance with the invention, a variable delay buffer, comprising a frequency reference input, a differential input circuit coupled to said frequency reference input and operative to generate an output clock signal in accordance thereto and an adjustment circuit coupled to said differential input circuit, said adjustment circuit operative to introduce a controllable mismatch in said differential input circuit thereby introducing a variable delay in said output clock signal.

There is also provided in accordance with the invention, a phase locked loop (PLL), comprising a frequency reference input, a buffer coupled to said frequency reference input, said buffer operative to generate a digital output clock signal therefrom, said buffer comprising a differential input circuit coupled to said frequency reference input and operative to generate said output clock signal in accordance thereto, an adjustment circuit coupled to said differential input circuit, said adjustment circuit operative to introduce a controllable mismatch in said differential input circuit thereby introducing a variable delay in said output clock signal, and a radio frequency (RF) output having a frequency in accordance with the frequency of said output clock signal.

There is further provided in accordance with the invention, a phase locked loop (PLL), comprising a frequency reference input a buffer coupled to said frequency reference input, said buffer operative to generate a digital output clock signal therefrom, said buffer comprising a differential input circuit coupled to said frequency reference input and operative to generate an output signal in accordance thereto, a current source coupled to said differential input circuit, said current source operative to bias said differential input circuit, an adjustment circuit coupled to said current source, said adjustment circuit operative to modify the current generated by said current source thereby introducing a variable delay in said output clock signal, and a radio frequency (RF) output having a frequency in accordance with the frequency of said output clock signal.

There is also provided in accordance with the invention, a phase locked loop (PLL), comprising a buffer, comprising a frequency reference input, a slicer circuit operative to generate a digital output clock signal response to said frequency reference input, an adjustment circuit coupled to said slicer circuit, said adjustment circuit operative to introduce variable delay into said digital output clock signal in accordance with a control sequence signal, and a radio frequency (RF) output having a frequency in accordance with the frequency of said output clock signal.

There is further provided in accordance with the invention, a single chip radio, comprising a phase locked loop (PLL) comprising a buffer, said buffer comprising a frequency reference input, a slicer circuit operative to generate a digital output clock signal response to said frequency reference input, an adjustment circuit coupled to said slicer circuit, said adjustment circuit operative to introduce variable delay into said digital output clock signal in accordance with a control sequence signal, a transmitter coupled to said phase locked loop, a receiver coupled to said phase locked loop, and a baseband processor coupled to said transmitter and said receiver.

BRIEF DESCRIPTION OF THE DRAWINGS

The invention is herein described, by way of example only, with reference to the accompanying drawings, wherein.

DETAILED DESCRIPTION OF THE INVENTION

Notation Used Throughout

Figure 1:
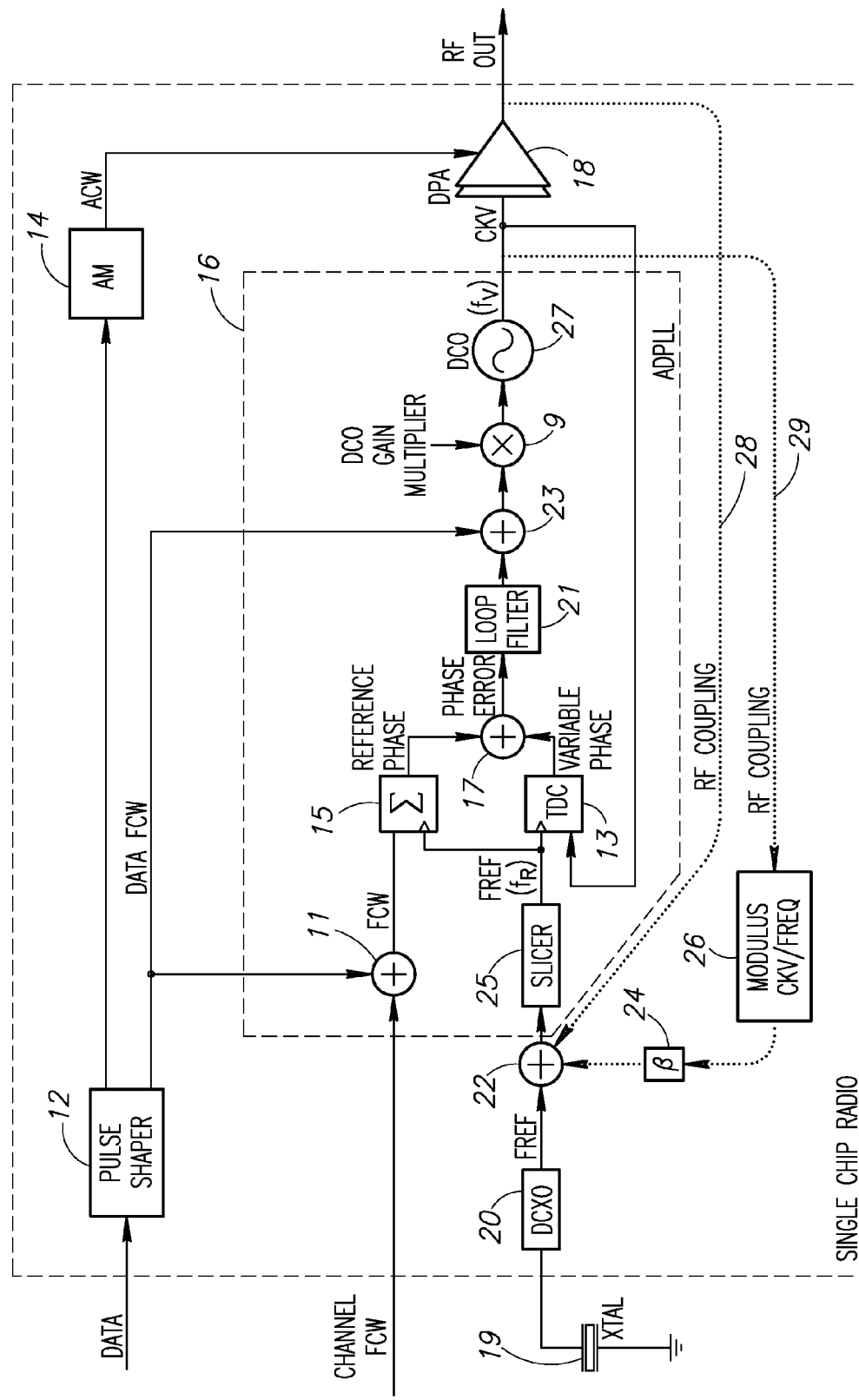
FIG. 1 is a diagram illustrating a first example prior art single chip polar transceiver radio showing a transmitter incorporating an all digital phase locked loop (ADPLL) based transmitter circuits, as well as potential parasitic coupling paths.
Figure 2:
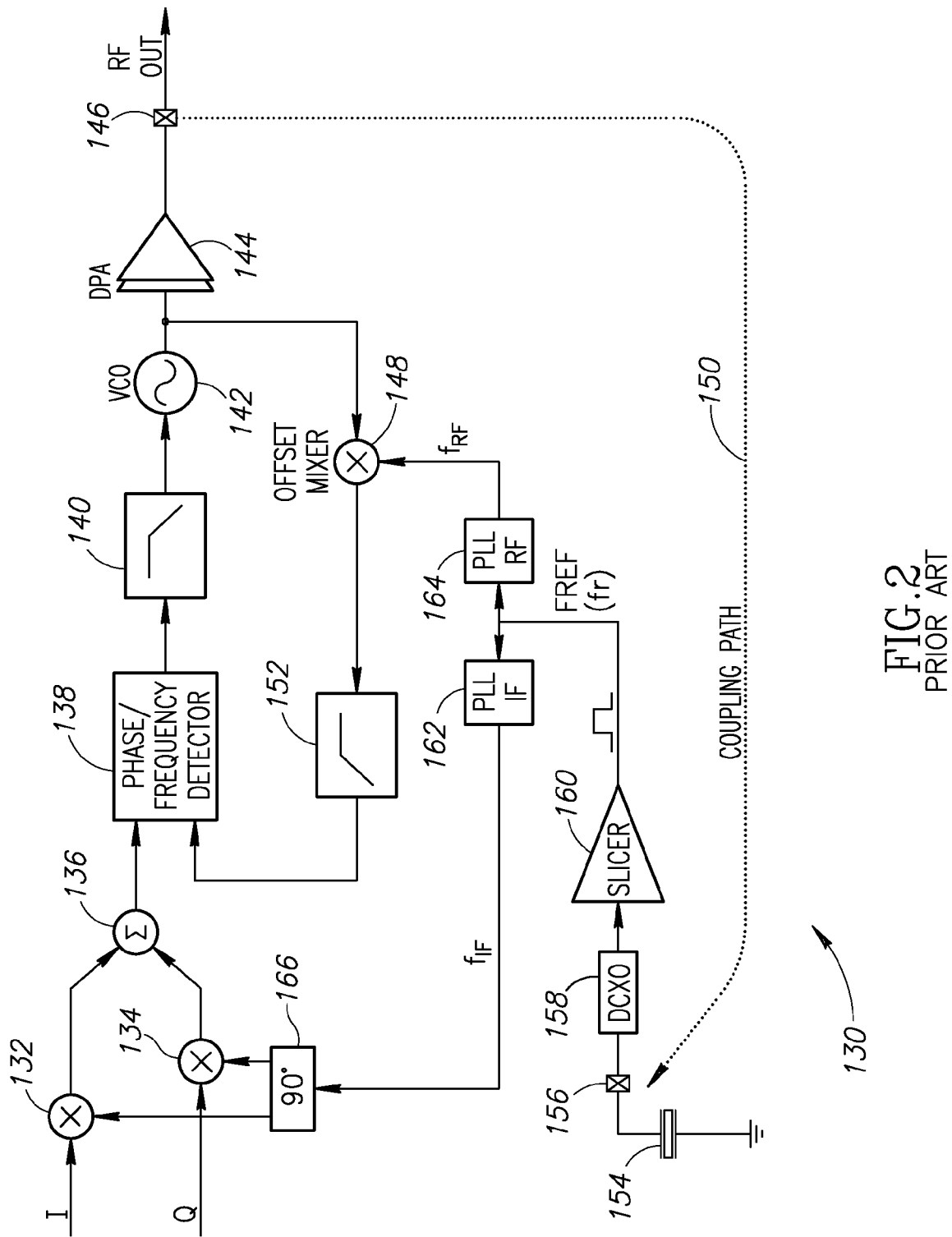
FIG. 2 is a block diagram illustrating a second example prior art single chip radio transceiver incorporating an on-chip DCXO buffer and showing the potential parasitic coupling paths.

The following notation is used throughout this document.

| Term | Definition |
| --- | --- |
| AC | Alternating Current |
| ACW | Amplitude Control Word |
| ADC | Analog to Digital Converter |
| ADPLL | All Digital Phase Locked Loop |
| AM | Amplitude Modulation |
| ASIC | Application Specific Integrated Circuit |
| AVI | Audio Video Interface |
| BIST | Built-In Self Test |
| BMP | Windows Bitmap |
| CCB | Coarse Control Bit |
| CMOS | Complementary Metal Oxide Semiconductor |
| CPU | Central Processing Unit |
| DBB | Digital Baseband |
| DC | Direct Current |
| DCO | Digitally Controlled Oscillator |
| DCXO | Digitally Controlled Crystal Oscillator |
| DPA | Digitally Controlled Power Amplifier |
| DRAC | Digital to RF Amplitude Conversion |
| DRP | Digital RF Processor or Digital Radio Processor |
| DSL | Digital Subscriber Line |
| DSP | Digital Signal Processor |
| EDGE | Enhanced Data Rates for GSM Evolution |
| EDR | Enhanced Data Rate |
| EPROM | Erasable Programmable Read Only Memory |
| FCB | Fine Control Bit |
| FCW | Frequency Command Word |
| FEM | Front End Module |
| FIB | Focused Ion Beam |
| FM | Frequency Modulation |
| FPGA | Field Programmable Gate Array |
| GMSK | Gaussian Minimum Shift Keying |
| GPS | Global Positioning System |
| GSM | Global System for Mobile communications |
| HB | High Band |
| HDL | Hardware Description Language |
| HPF | High Pass Filter |
| IC | Integrated Circuit |
| IEEE | Institute of Electrical and Electronics Engineers |
| IF | Intermediate Frequency |
| IIR | Infinite Impulse Response |
| JPG | Joint Photographic Experts Group |
| LAN | Local Area Network |
| LB | Low Band |
| LDO | Low Drop Out |
| LO | Local Oscillator |
| MBOA | Multiband OFDM Alliance |
| MIM | Metal Insulator Metal |
| MOS | Metal Oxide Semiconductor |
| MP3 | MPEG-1 Audio Layer 3 |
| MPG | Moving Picture Experts Group |
| NMOS | n-channel Metal Oxide Semiconductor |
| OFDMA | Orthogonal Frequency Division Multiple Access |
| PA | Power Amplifier |
| PC | Personal Computer |
| PCB | Printed Circuit Board |
| PCI | Peripheral Component Interconnect |
| PDA | Personal Digital Assistant |
| PFD | Phase/Frequency Detector |
| PHE | Phase Error |
| PLL | Phase Locked Loop |
| PM | Phase Modulation |
| PMOS | p-channel Metal Oxide Semiconductor |
| PPA | Pre-Power Amplifier |
| RAM | Random Access Memory |
| RAT | Radio Access Technology |
| RF | Radio Frequency |
| RFBIST | RF Built-In Self Test |
| RMS | Root Mean Squared |
| ROM | Read Only Memory |
| SAM | Sigma-Delta Amplitude Modulation |
| SAW | Surface Acoustic Wave |
| SDIO | Secure Digital Input Output |
| SIM | Subscriber Identity Module |
| SoC | System on Chip |
| SPI | Serial Peripheral Interface |
| SRAM | Static Random Access Memory |
| TDC | Time to Digital Converter |
| TV | Television |
| USB | Universal Serial Bus |
| UWB | Ultra Wideband |
| VCO | Voltage Controlled Oscillator |
| WCDMA | Wideband Code Division Multiple Access |
| WiFi | Wireless Fidelity |
| WiMAX | Worldwide Interoperability for Microwave Access |
| WiMedia | Radio platform for UWB |
| WLAN | Wireless Local Area Network |
| WMA | Windows Media Audio |
| WMV | Windows Media Video |
| WPAN | Wireless Personal Area Network |

DETAILED DESCRIPTION OF THE INVENTION

The present invention is a novel and useful variable delay digitally controlled crystal oscillator (DCXO) buffer also referred to as a slicer. The circuit of the present invention comprises a modification to a slicer circuit following the DCXO to introduce a controlled variable delay into the buffered DCXO clock. The resultant output clock signal is then used as input to the TDC of an ADPLL circuit (or, in general, to a phase detector of a conventional PLL) to alleviate the subharmonic mixing based deterioration caused by LO/TX coupling through the crystal pins, and to alleviate the deadbeat effects caused by the finite resolution of the TDC.

The invention is applicable to single chip radios with high levels of integration such as multi-band and/or multi-mode cellular radios that integrate the RF circuitry with the digital base band (DBB) circuitry on the same die or on close proximity thereto so as to exhibit interference from the transmit RF output signal coupling back into the frequency reference input. In a single chip radio, the reference frequency circuit area with its associated bond pads, bond wires, etc. is very close to the VCO and RF output buffers and their associated bond pads and wires.

Although the variable delay slicer mechanism is applicable to numerous wireless communication standards and can be incorporated in numerous types of wireless or wired communication devices such a multimedia player, mobile station, user equipment, cellular phone, PDA, DSL modem, WPAN device, etc., it is described in the context of a digital RF processor (DRP) based transmitter that may be adapted to comply with a particular wireless communications standard such as GSM, Bluetooth, EDGE, WCDMA, WLAN, WiMax, UWB, OFDMA, etc. It is appreciated, however, that the invention is not limited to use with any particular communication standard and may be used in optical, wired and wireless applications. Further, the invention is not limited to use with a specific modulation scheme but is applicable to any modulation scheme including both digital and analog modulations where there is a need to mitigate the interference affects of the coupling of the transmit RF output signal back into the frequency reference input. In addition, the inventions are not limited to be used in a DCXO buffer, but may be used in numerous types of oscillator buffers.

Note that throughout this document, the term communications device is defined as any apparatus or mechanism adapted to transmit, receive or transmit and receive data through a medium. The term communications transceiver or communications device is defined as any apparatus or mechanism adapted to transmit and receive data through a medium. The communications device or communications transceiver may be adapted to communicate over any suitable medium, including wireless or wired media. Examples of wireless media include RF, infrared, optical, microwave, UWB, Bluetooth, WiMAX, WiMedia, WiFi, or any other broadband medium, etc. Examples of wired media include twisted pair, coaxial, optical fiber, any wired interface (e.g., USB, Firewire, Ethernet, etc.). The term Ethernet network is defined as a network compatible with any of the IEEE 802.3 Ethernet standards, including but not limited to 10Base-T, 100Base-T or 1000Base-T over shielded or unshielded twisted pair wiring. The terms communications channel, link and cable are used interchangeably. The notation DRP is intended to denote either a Digital RF Processor or Digital Radio Processor. References to a Digital RF Processor infer a reference to a Digital Radio Processor and vice versa. The term frequency reference input is intended to denote a signal that provides a waveform of a reference frequency, and in the context of this invention, it is typically not a clock signal having sharp edges.

The term multimedia player or device is defined as any apparatus having a display screen and user input means that is capable of playing audio (e.g., MP3, WMA, etc.), video (AVI, MPG, WMV, etc.) and/or pictures (JPG, BMP, etc.). The user input means is typically formed of one or more manually operated switches, buttons, wheels or other user input means. Examples of multimedia devices include pocket sized personal digital assistants (PDAs), personal media player/recorders, cellular telephones, handheld devices, and the like.

Some portions of the detailed descriptions which follow are presented in terms of procedures, logic blocks, processing, steps, and other symbolic representations of operations on data bits within a computer memory. These descriptions and representations are the means used by those skilled in the data processing arts to most effectively convey the substance of their work to others skilled in the art. A procedure, logic block, process, etc., is generally conceived to be a self-consistent sequence of steps or instructions leading to a desired result. The steps require physical manipulations of physical quantities. Usually, though not necessarily, these quantities take the form of electrical or magnetic signals capable of being stored, transferred, combined, compared and otherwise manipulated in a computer system. It has proven convenient at times, principally for reasons of common usage, to refer to these signals as bits, bytes, words, values, elements, symbols, characters, terms, numbers, or the like.

It should be born in mind that all of the above and similar terms are to be associated with the appropriate physical quantities they represent and are merely convenient labels applied to these quantities. Unless specifically stated otherwise as apparent from the following discussions, it is appreciated that throughout the present invention, discussions utilizing terms such as 'processing,' 'computing,' 'calculating,' 'determining,' 'displaying' or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The invention can take the form of an entirely hardware embodiment, an entirely software embodiment or an embodiment containing a combination of hardware and software elements. In one embodiment, a portion of the mechanism of the invention is implemented in software, which includes but is not limited to firmware, resident software, object code, assembly code, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium is any apparatus that can contain, store, communicate, propagate, or transport the program for use by or in connection with the instruction execution system, apparatus, or device, e.g., floppy disks, removable hard drives, computer files comprising source code or object code, flash semiconductor memory (USB flash drives, etc.), ROM, EPROM, or other semiconductor memory devices.

Single Chip Radio

Figure 3:
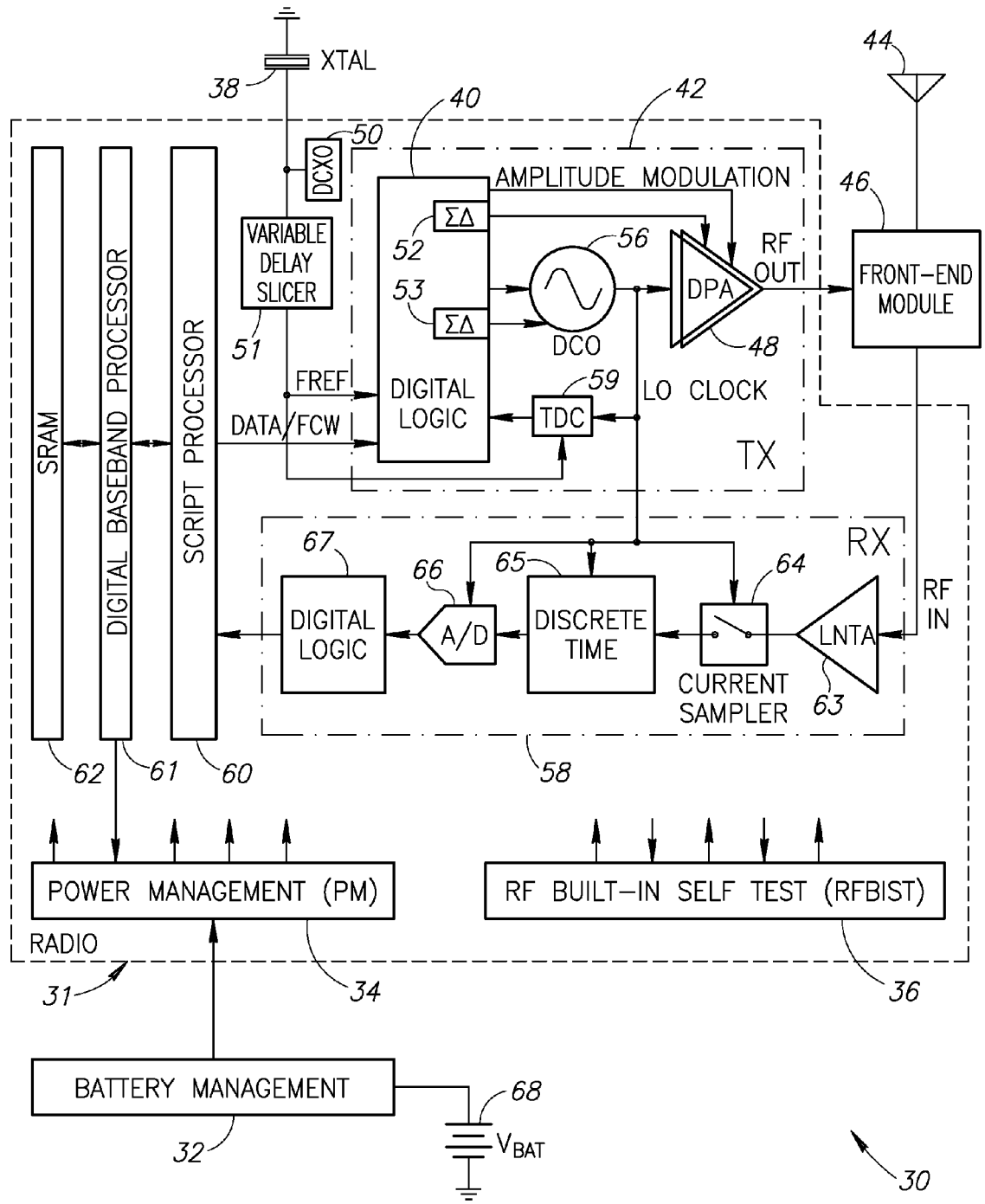
FIG. 3 is a block diagram illustrating an example single chip radio incorporating an on-chip variable delay slicer (i.e. DCXO buffer) of the present invention.

A block diagram illustrating an example single chip radio incorporating an on-chip variable delay slicer (i.e. DCXO buffer) of the present invention is shown in FIG. 3. For illustration purposes only, the transmitter, as shown, is adapted for the GSM/EDGE cellular standards. It is appreciated, however, that one skilled in the communication arts can adapt the transmitter illustrated herein to other modulations and communication standards as well without departing from the spirit and scope of the present invention.

The radio circuit, generally referenced 30, comprises a single chip radio integrated circuit (IC) 31 coupled to a crystal 38, RF front end module (FEM) 46, antenna 44 and battery management circuit 32 connected to a battery 68. The radio chip 31 comprises a script processor 60, digital baseband (DBB) processor 61, memory 62 (e.g., static RAM), TX block 42, RX block 58, digitally controlled crystal oscillator (DCXO) 50, variable delay slicer 51, power management unit 34, and RF built-in self test (BIST) 36 The TX block comprises high speed and low speed digital logic block 40 including $\Sigma\Delta$ modulators 52, 53, digitally controlled oscillator (DCO) 56, TDC 59 and digitally controlled power amplifier (DPA) or pre-power amplifier (PPA) 48. The ADPLL and transmitter generate various radio frequency signals. The RX block comprises a low noise transconductance amplifier 63, current sampler 64, discrete time processing block 65, analog to digital converter (ADC) 66 and digital logic block 67.

In accordance with the invention, the radio comprises a variable delay slicer operative to intentionally introduce controlled jitter into the clock signal output of the slicer in response to a digital control sequence input. It is noted that the variable delay slicer mechanism is applicable to any type of PLL or frequency synthesizer, especially those with high integration wherein the frequency reference buffer is on-chip in close physical proximity to the higher power transmit RF output signal.

The principles presented herein have been used to develop three generations of a Digital RF Processor (DRP): single-chip Bluetooth, GSM and GSM/EDGE radios realized in 130 nm, 90 nm and 65 nm digital CMOS process technologies, respectively. The common architecture is highlighted in FIG. 3 with features added specific to the cellular radio. The all digital phase locked loop (ADPLL) based transmitter employs a polar architecture with all digital phase/frequency and amplitude modulation paths. The receiver employs a discrete-time architecture in which the RF signal is directly sampled and processed using analog and digital signal processing techniques.

A key component is the digitally controlled oscillator (DCO) 56, which avoids any analog tuning controls. A digitally-controlled crystal oscillator (DCXO) generates a high-quality base station-synchronized frequency reference such that the transmitted carrier frequencies and the received symbol rates are accurate to within 0.1 ppm. Fine frequency resolution is achieved through high-speed ΣΔ dithering of its varactors. Digital logic built around the DCO realizes an all-digital PLL (ADPLL) that is used as a local oscillator for both the transmitter and receiver. The polar transmitter architecture utilizes the wideband direct frequency modulation capability of the ADPLL and a digitally controlled power amplifier (DPA) 48 for the amplitude modulation. The DPA operates in near-class-E mode and uses an array of nMOS transistor switches to regulate the RF amplitude and acts as a digital-to-RF amplitude converter (DRAC). It is followed by a matching network and an external RF front-end module 46, which comprises a power amplifier (PA), a transmit/receive switch for the common antenna 44 and RX surface acoustic wave (SAW) filters. Fine amplitude resolution is achieved through high-speed ΣΔ dithering of the DPA nMOS transistors.

The receiver 58 employs a discrete-time architecture in which the RF signal is directly sampled at the Nyquist rate of the RF carrier and processed using analog and digital signal processing techniques. The transceiver is integrated with a script processor 60, dedicated digital base band processor 61 (i.e., ARM family processor and DSP) and SRAM memory 62. The script processor handles various TX and RX calibration, compensation, sequencing and lower-rate data path tasks and encapsulates the transceiver complexity in order to present a much simpler software programming model.

The frequency reference (FREF) is generated on-chip by a 26 MHz (could be 38.4 MHz or other) digitally controlled crystal oscillator (DCXO) 50 coupled to variable delay slicer 51. An integrated power management (PM) system is connected to an external battery management circuit 32 that conditions and stabilizes the supply voltage. The PM comprises multiple low drop out (LDO) regulators that provide internal supply voltages and also isolate supply noise between circuits, especially protecting the DCO. The RF built-in self-test (RFBIST) 36 performs autonomous phase noise and modulation distortion testing, various loopback configurations for bit-error rate measurements. The transceiver is integrated with the digital baseband, SRAM in a complete system-on-chip (SoC) solution. Almost all the clocks on this SoC are derived from and are synchronous to the RF oscillator clock. This helps to reduce susceptibility to the noise generated through clocking of the massive digital logic.

The transmitter comprises a polar architecture in which the amplitude and phase/frequency modulations are implemented in separate paths. Transmitted symbols generated in the digital baseband (DBB) processor are first pulse-shape filtered in the Cartesian coordinate system. The filtered in-phase (I) and quadrature (Q) samples are then converted through a CORDIC algorithm into amplitude and phase samples of the polar coordinate system. The phase is then differentiated to obtain frequency deviation. The polar signals are subsequently conditioned through signal processing to sufficiently increase the sampling rate in order to reduce the quantization noise density and lessen the effects of the modulating spectrum replicas.

A more detailed description of the operation of the ADPLL can be found in U.S. Patent Publication No. 2006/0033582A1, published Feb. 16, 2006, to Staszewski et al., entitled "Gain Calibration of a Digital Controlled Oscillator," U.S. Patent Publication No. 2006/0038710A1, published Feb. 23, 2006, to Staszewski et al., entitled "Hybrid Polar/Cartesian Digital Modulator" and U.S. Pat. No. 6,809,598, to Staszewski et al., entitled "Hybrid Of Predictive And Closed-Loop Phase-Domain Digital PLL Architecture," all of which are incorporated herein by reference in their entirety.

Mobile Device Incorporating the Variable Delay Slicer Mechanism

Figure 4:
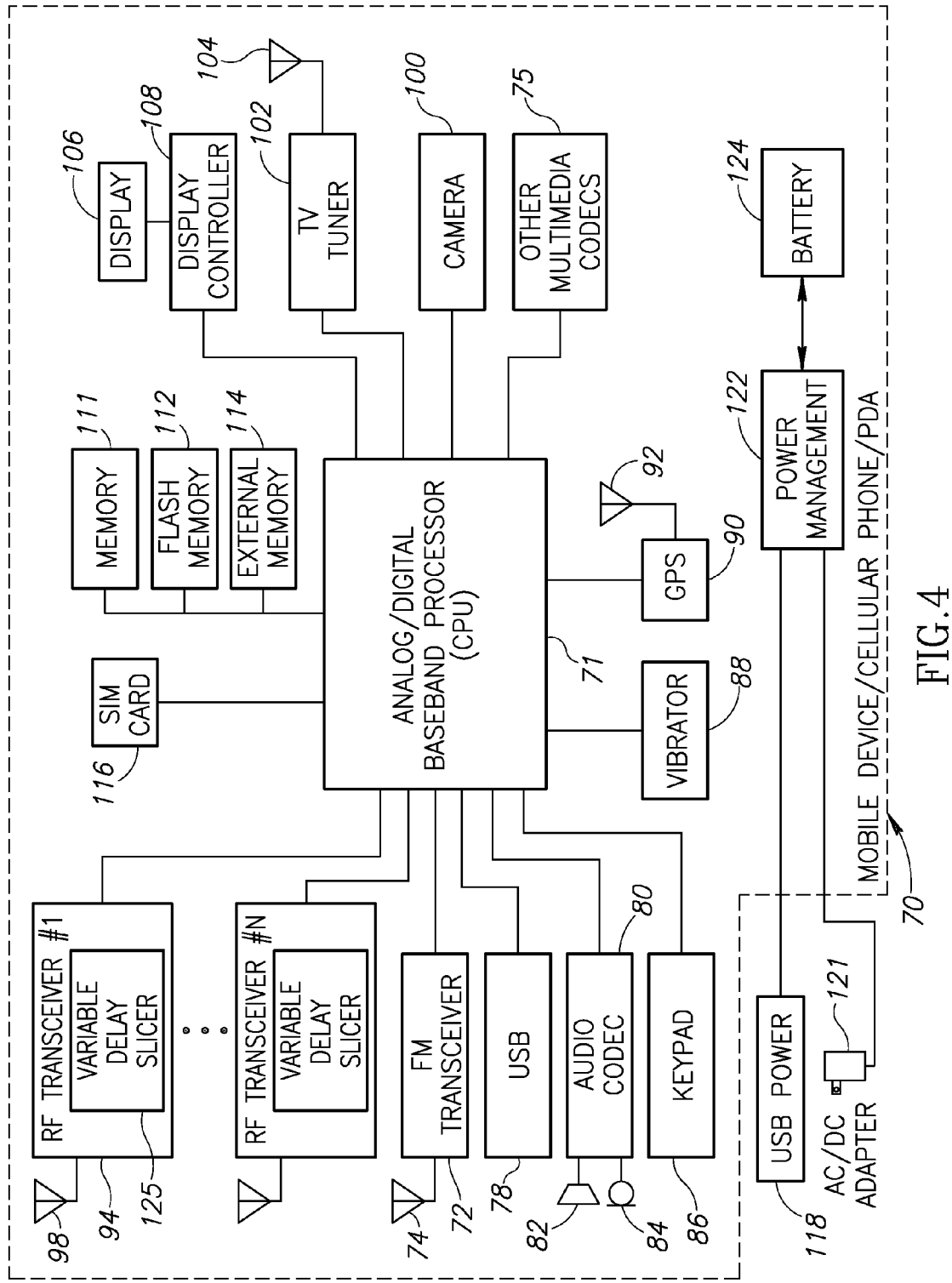
FIG. 4 is a simplified block diagram illustrating an example mobile communication device incorporating the variable delay slicer mechanism of the present invention.

A simplified block diagram illustrating an example mobile communication device incorporating the variable delay slicer mechanism of the present invention is shown in FIG. 4. Note that the mobile device may comprise any suitable wired or wireless device such as multimedia player, mobile communication device, cellular phone, smartphone, PDA, Bluetooth device, etc. For illustration purposes only, the device is shown as a mobile device, such as a cellular phone. Note that this example is not intended to limit the scope of the invention as the variable delay slicer mechanism of the present invention can be implemented in a wide variety of communication devices.

The mobile device, generally referenced 70, comprises a baseband processor or CPU 71 having analog and digital portions. The mobile device may comprise a plurality of RF transceivers 94 and associated antennas 98. RF transceivers for the basic cellular link and any number of other wireless standards and RATs may be included. Examples include, but are not limited to, Global System for Mobile Communication (GSM)/GPRS/EDGE 3G; CDMA; WiMAX for providing WiMAX wireless connectivity when within the range of a WiMAX wireless network; Bluetooth for providing Bluetooth wireless connectivity when within the range of a Bluetooth wireless network; WLAN for providing wireless connectivity when in a hot spot or within the range of an ad hoc, infrastructure or mesh based wireless LAN network; near field communications; UWB; etc. One or more of the RF transceivers may comprise additional antennas to provide antenna diversity which yields improved radio performance. The mobile device may also comprise internal RAM and ROM memory 110, Flash memory 112 and external memory 114.

Several user interface devices include microphone(s) 84, speaker(s) 82 and associated audio codec 80 or other multimedia codecs 75, a keypad for entering dialing digits 86, vibrator 88 for alerting a user, camera and related circuitry 100, a TV tuner 102 and associated antenna 104, display(s) 106 and associated display controller 108 and GPS receiver 90 and associated antenna 92. A USB or other interface connection 78 (e.g., SPI, SDIO, PCI, etc.) provides a serial link to a user's PC or other device. An FM transceiver 72 and antenna 74 provide the user the ability to listen to FM broadcasts as well as the ability to transmit audio over an unused FM station at low power, such as for playback over a car stereo. SIM card 116 provides the interface to a user's SIM card for storing user data such as address book entries, etc. It should be appreciated from the above description that there exist a multitude of aggressor high-frequency clocks and signals from various co-locating radios that can couple into sensitive nodes of lower-frequency clock buffers and produce timing distortions that can affect performance.

The RF transceivers 94 also comprise the variable delay slicer mechanism 125 of the present invention. The variable delay slicer may be implemented in any number of the RF transceivers. Alternatively (or in addition to), the variable delay slicer mechanism may be implemented as a task executed by the baseband processor 71. The variable delay slicer blocks 125 are adapted to implement the variable delay slicer mechanism of the present invention as described in more detail infra. In operation, the variable delay slicer may be implemented as hardware, software or as a combination of hardware and software. Implemented as a software task, the program code operative to implement the variable delay slicer mechanism of the present invention is stored in one or more memories 110, 112 or 114 or local memories within the baseband.

Portable power is provided by the battery 124 coupled to power management circuitry 122. External power is provided via USB power 118 or an AC/DC adapter 120 connected to the battery management circuitry which is operative to manage the charging and discharging of the battery 124.

Figure 5:
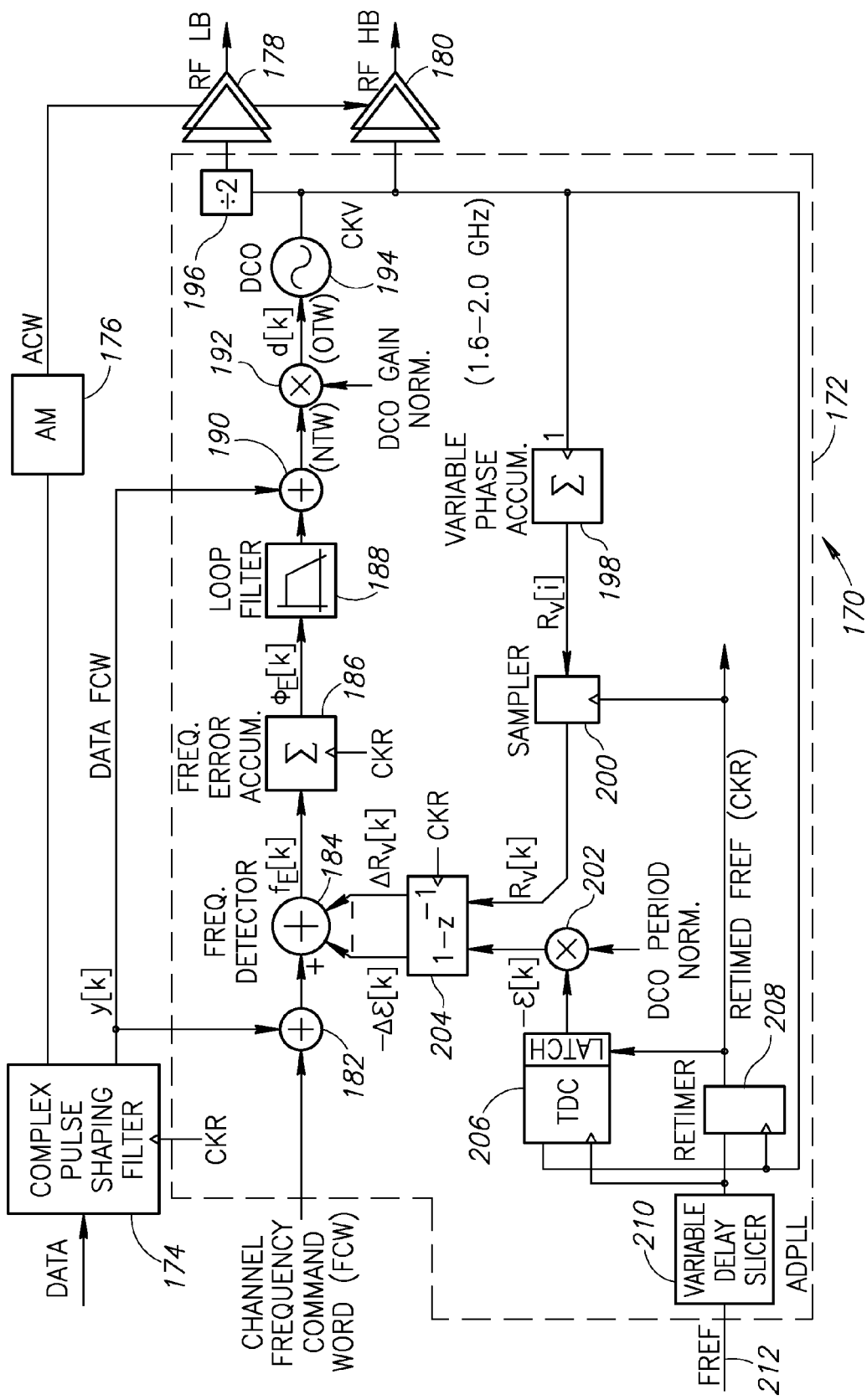
FIG. 5 is a block diagram illustrating an example ADPLL incorporating the variable delay slicer mechanism of the present invention.

ADPLL Polar Transmitter Incorporating Frequency Reference Dithering Mechanism A block diagram illustrating an example ADPLL incorporating the variable delay slicer mechanism of the present invention is shown in FIG. 5. The ADPLL presented herein is provided as an example application of the variable delay slicer of the present invention. It is appreciated that the variable delay slicer may be applied to numerous other circuits as well without departing from the scope of the invention.

A more detailed description of the operation of the ADPLL can be found in U.S. Patent Publication No. 2006/0033582A1, published Feb. 16, 2006, to Staszewski et al., entitled "Gain Calibration of a Digital Controlled Oscillator," U.S. Patent Publication No. 2006/0038710A1, published Feb. 23, 2006, to Staszewski et al., entitled "Hybrid Polar/Cartesian Digital Modulator" and U.S. Pat. No. 6,809,598, to Staszewski et al., entitled "Hybrid Of Predictive And Closed-Loop Phase-Domain Digital PLL Architecture," all of which are incorporated herein by reference in their entirety.

For illustration purposes only, the transmitter, as shown, is adapted for the GSM/EDGE cellular standards. It is appreciated, however, that one skilled in the communication arts can adapt the transmitter illustrated herein to other modulations and communication standards as well without departing from the spirit and scope of the present invention.

The transmitter, generally referenced 170, is well-suited for a deep-submicron CMOS implementation. The transmitter comprises a complex pulse shaping filter 174, amplitude modulation (AM) block 176 and ADPLL 172. The circuit 170 is operative to perform complex modulation in the polar domain in addition to the generation of the local oscillator (LO) signal for the receiver. All clocks in the system are derived directly from this source. Note that the transmitter is constructed using digital techniques that exploit the high speed and high density of the advanced CMOS, while avoiding problems related to voltage headroom. The ADPLL circuit replaces a conventional RF synthesizer architecture (based on a voltage-controlled oscillator (VCO) and a phase/frequency detector and charge-pump combination), with a digitally controlled oscillator (DCO) 194 and a time-to-digital converter (TDC) 206. All inputs and outputs are digital and some even at multi-GHz frequency.

The core of the ADPLL is a digitally controlled oscillator (DCO) 194 adapted to generate the RF oscillator clock CKV. The oscillator core (not shown) operates at least twice the 1.6-2.0 GHz high band frequency or at least four times the 0.8-1.0 GHz low band frequency. The output of the DCO is then divided for precise generation of RX quadrature signals, and for use as the transmitter's carrier frequency. The single DCO is shared between transmitter and receiver and is used for both the high frequency bands (HB) and the low frequency bands (LB). In additional to the integer control of the DCO, at least 3-bits of the minimal varactor size used are dedicated for ΣΔ dithering in order to improve frequency resolution. The DCO comprises a plurality of varactor banks, which may be realized as MOS capacitor (MOSCAP) devices or Metal Insulator Metal (MIM) devices that operate in the flat regions of their C-V curves to assist digital control. The output of the DCO is input to the RF high band pre-power amplifier (PPA) 180. It is also input to the RF low band pre-power amplifier 178 after divide by two via divider 196.

The expected variable frequency $f_V$ is related to the reference frequency $f_R$ by the frequency command word (FCW).

$$FCW[k] \equiv \frac{E(f_V[k])}{f_R} \quad (1)$$

The FCW is time variant and is allowed to change with every cycle $T_R = 1/f_R$ of the frequency reference clock. With $W_F = 24$ the word length of the fractional part of FCW, the ADPLL provides fine frequency control with 1.5 Hz accuracy, according to:

$$\Delta f_{res} = \frac{f_R}{2^{W_F}} \quad (2)$$

The number of integer bits $W_I = 8$ has been chosen to fully cover the GSM/EDGE frequency range of $f_V = 1{,}600\text{-}2{,}000$ MHz with an arbitrary reference frequency $f_R \geq 8$ MHz.

The ADPLL operates in a digitally-synchronous fixed-point phase domain as follows: The variable phase accumulator 198 determines the variable phase $R_V[i]$ by counting the number of rising clock transitions of the DCO oscillator clock CKV as expressed below.

$$R_V[i] = \sum_{l=0}^{i} 1 \quad (3)$$

The index i indicates the DCO edge activity. The variable phase $R_V[i]$ is sampled via sampler 200 to yield sampled FREF variable phase $R_V[k]$, where k is the index of the FREF edge activity. The sampled FREF variable phase $R_V[k]$ is fixed-point concatenated with the normalized time-to-digital converter (TDC) 206 output $\epsilon[k]$. The TDC measures and quantizes the time differences between the frequency reference FREF and the DCO clock edges. The sampled differentiated (via block 204) variable phase is subtracted from the frequency command word (FCW) by the digital frequency detector 184. The frequency error $f_E[k]$ samples $$f_E[k] = FCW - [(R_V[k] - \epsilon[k]) - (R_V[k-1] - \epsilon[k-1])] \quad (4)$$

are accumulated via the frequency error accumulator 186 to create the phase error $\phi_E[k]$ samples $$\phi_E[k] = \sum_{l=0}^{k} f_E[k] \quad (5)$$

which are then filtered by a fourth order IIR loop filter 188 and scaled by a proportional loop attenuator $\alpha$. A parallel feed with coefficient $\rho$ adds an integrated term to create type-II loop characteristics which suppress the DCO flicker noise.

The IIR filter is a cascade of four single stage filters, each satisfying the following equation:

$$y[k] = (1-\lambda) \cdot y[k-1] + \lambda \cdot x[k] \quad (6)$$

wherein x[k] is the current input;

y[k] is the current output;
k is the time index;
λ is the configurable coefficient;
The 4-pole IIR loop filter attenuates the reference and TDC quantization noise with an 80 dB/dec slope, primarily to meet the GSM/EDGE spectral mask requirements at 400 kHz offset. The filtered and scaled phase error samples are then multiplied by the DCO gain $K_{DCO}$ normalization factor $f_R/\hat{K}_{DCO}$ via multiplier 192, where $f_R$ is the reference frequency and $\hat{K}_{DCO}$ is the DCO gain estimate, to make the loop characteristics and modulation independent from $K_{DCO}$. The modulating data is injected into two points of the ADPLL for direct frequency modulation, via adders 182 and 190. A hitless gear-shifting mechanism for the dynamic loop bandwidth control serves to reduce the settling time. It changes the loop attenuator α several times during the frequency locking while adding the $(\alpha_1/\alpha_2-1)\phi_1$ dc offset to the phase error, where indices 1 and 2 denote before and after the event, respectively. Note that $\phi_1=\phi_2$, since the phase is to be continuous.

The FREF input is resampled by the RF oscillator clock CKV via retimer block 208 which may comprise a flip flop or register clocked by the reference frequency FREF. The resulting retimed clock (CKR) is distributed and used throughout the system. This ensures that the massive digital logic is clocked after the quiet interval of the phase error detection by the TDC. Note that in the example embodiment described herein, the ADPLL is a discrete-time sampled system implemented with all digital components connected with all digital signals.

In accordance with the invention, the transmitter 170 also comprises a variable delay slicer 210 of the present invention, described in more detail infra. The slicer introduces intentional jitter in a controlled fashion to the output clock signal thereby mitigating the impact of the interference of the transmit RF output interference to the frequency reference input.

Reference Clock Interference and Mitigation Mechanism

To aid in understanding the principles of operation of the present invention, a detailed description of the problem and its solution is presented below. In particular, a detailed analysis of the interference to the frequency reference clock and the means for its mitigation is presented.

The interference suffered by the reference clock (FREF) results in intolerable jitter thereon when the transmitter output frequency is centered at an integer multiple (or close thereof) of the FREF clock. In the worst case, a consequence of this interference is potentially failing to meet specifications for phase-error in bursts or packets transmitted at integer channels, resulting from the excessive FREF noise that is tracked by the ADPLL and exhibits itself on the modulated RF carrier. A mathematical model for the interference mechanism is presented as well as the mathematical analyses explaining the performance improvements that were observed through the frequency reference dithering mechanisms of the present invention.

Properties of the Victim Signal FREF and Related Circuitry

The reference clock FREF is a square-wave signal nominally tuned within the DCXO to 38.4 MHz for the example DCXO presented herein, which is a crystal resonant frequency, having rise and fall times in the order of 50 ps. Note that other resonant frequencies may be used such as 26 MHz, 52 MHz depending on the particular implementation. The clock signal is generated within the slicer in the DCXO block, where the sine wave output of the DCXO is converted into a square-wave clock. The clock signal is then passed from the VDDX (where 'X' refers to crystal) domain to the digital circuitry in the VDD_DIG domain through routing that may comprise several hundred micrometers. Several possible mechanisms of interference along this signal path could potentially result in its contamination and were investigated through simulations, as well as a series of focused ion beam (FIB) modifications and experiments, as described below.

First, additive interference induced onto the input signal of any block processing FREF (e.g., originating from a sufficiently strong aggressor and coupled through parasitic capacitances). Such additive noise could possibly be picked up at the input to the slicer, on the several hundred micrometer line leading from the DCXO circuitry to the TDC or within the TDC circuitry itself. Second, Vdd/GND interference resulting from inductive coupling through bond wires, which would modulate the supply lines and equivalently the circuit's threshold. Third, Vdd contamination and ground bounces as a result of the use of a common supply (i.e. current surges on the digital supply that are not sufficiently suppressed by decoupling capacitances).

Figure 6:
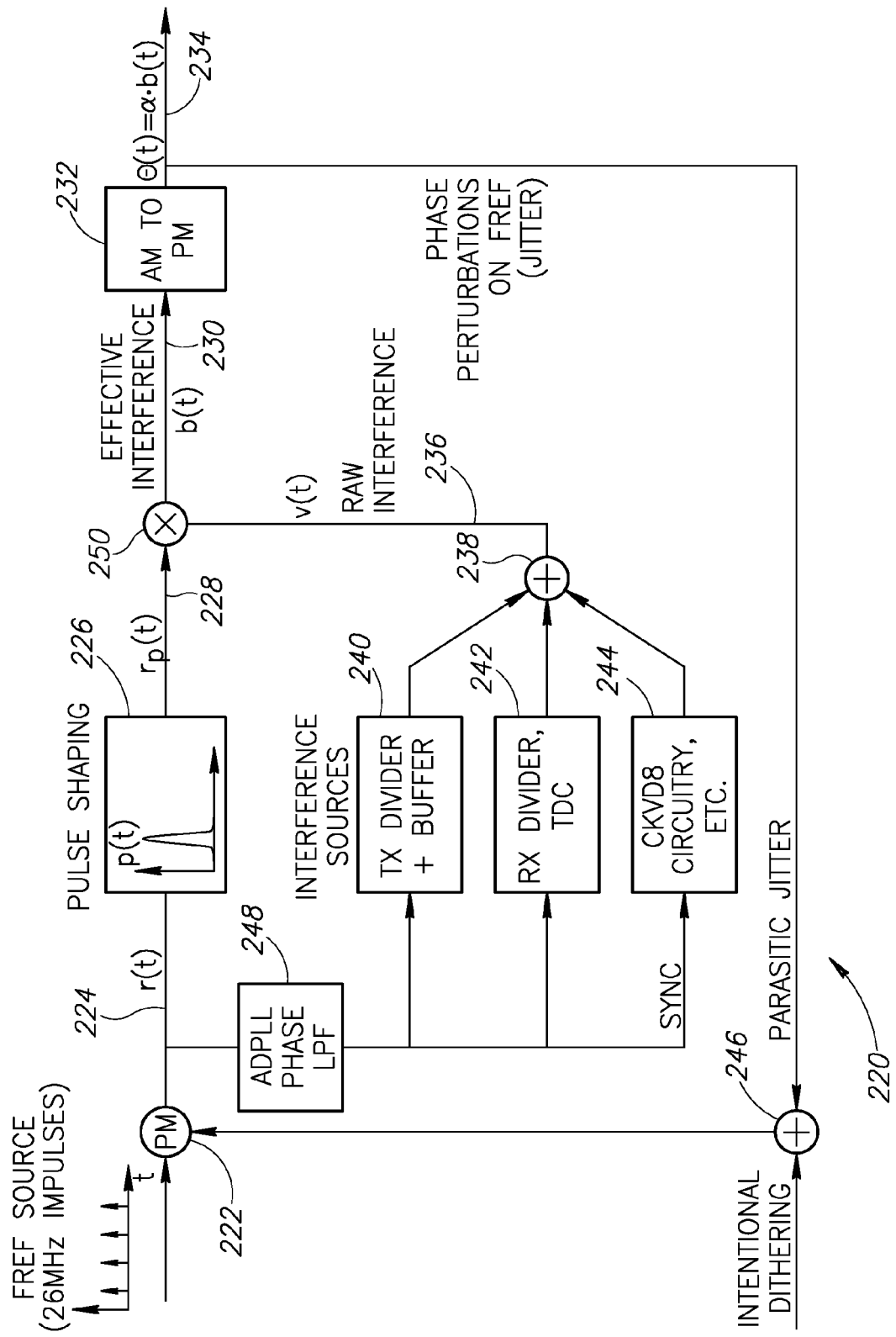
FIG. 6 is an equivalent block of the general interference mechanism model.

All three of the above cases effectively constitute AM-to-PM mechanisms which convert the additive interference to jitter. The block diagram of FIG. 6 is an illustration of the interference model for the FREF signal, which would be generally applicable. The model, generally referenced 220, comprises an FREF phase modulation source 222, pulse shaping block 226, multiplier 250, AM to PM block 232, ADPLL model block 248, adders 238, 246 and a plurality of interference sources including TX divider/buffer 240, RX divider 242 and clock divider circuitry 244.

The various sources of RF interference are driven by the FREF signal and therefore produce signals that are frequency-synchronized with it. The output of this model is the time domain function θ(t) representing the parasitic phase perturbations on the FREF signal, which the interference induces through the AM to PM conversion occurring within the FREF circuitry.

It is these phase perturbations that cause the transmitter's output phase to deviate from the nominal modulation-phase-trajectory thus failing the limits or targets set forth for phase errors (depending on the particular specification).

Since the ADPLL tracks the phase of the FREF signal, a filtered and amplified form of these phase perturbations appear as additive interference in the transmitter's phase modulation, depending on the spectral properties of the signal θ(t) and the settings of the ADPLL (e.g., loop dynamics). Contrary to the loop dynamics, there is no freedom in the selection of the amplification factor, as it is dictated by the ratio between the required output carrier frequency and the FREF frequency of e.g., 26, 38.4 or 56 MHz (with 26 MHz used in the example calculations infra). Amongst the channels (e.g., 10 in the case of GSM) that suffer from this phenomenon, this phase amplification factor varies in the range 66 to 73, i.e. the highest integer channel has about 11% more interference gain.

For the lowest integer channel the amplification factor is 1716 MHz/26 MHz=66 which is approximately 20 log(66) or 36.4 dB, while for the highest integer channel the amplification factor is 1898 MHz/26 MHz=73 which is approximately 37.2 dB. It is noted that there may be various additional frequency dependent factors that could result in a difference in the level of interference experienced at the 10 channels of interest, such as the coupling factor through which the RF signal couples into the FREF circuitry.

Potential Sources of Interference

Aggressors

The CKV clock signal, being equal in frequency to the carrier frequency in high-band, is not the only potential source of interference, since there are several derivatives of it which serve to clock high-speed circuitry, such as CKVD8 (⅛ of the frequency of CKV). It has also been observed that the choice of the Script Processor clock, derived from CKV, has an effect on the transmitter phase-error performance.

Depending on the particular integer-N channel (i.e. if the ratio is an integer or substantially an integer), each of these derivatives of CKV could be "met" by an appropriately high harmonic of FREF that would down-convert it to zero, where it potentially creates low-frequency jitter on FREF. It is noted that in the absence of modulation (and phase noise), the CKV signal and its derivatives would, theoretically, only create a fixed phase shift in FREF, since their interference at the zero crossing instances (the sampling instances in the model of FIG. 6) would be the same at each sampling instance (equivalent to a DC shift in the FREF threshold). With modulation present, the various sources of interference, appearing at different multiples of FREF, do not represent the same interference, as the different frequency deviation on each of them would create a different signal once down-converted to zero by the appropriate FREF harmonic in the sampling operation.

For example, if the CKV signal were to be modulated with all ones (i.e. a fixed carrier frequency shift of about 68 kHz), the CKVD8 clock derivative would have a frequency shift of only 68/8=8.5 kHz from the nominal value of CKVD8=FREF×N/8. Consequently, the down conversion created by the FREF×N/8 harmonic (or $9^{th}$ FREF harmonic for the "super" integer channel CKV=1872 MHz) would yield a sine wave of 8.5 kHz at baseband, which would be the rate of jitter induced on the FREF signal once passed through the AM to PM conversion within the victim circuit.

Simultaneously, the FREF $72^{nd}$ harmonic (for CKV=1872 MHz) would down convert the 68 kHz shift on CKV to a 68 kHz sine wave, and the $36^{th}$ harmonic of FREF would down convert the 34 kHz shift on the 936 MHz CKVD2 signal to a 34 kHz sine wave frequency-modulating FREF. Note that the 936 MHz interference can originate from the low-band divider once activated.

The relationship between the three low-frequency products in this example would not necessarily be that of the magnitude of the three high-frequency interferers from which they originated (i.e. CKV, CKVD2 and CKVD8), due to the non-linear nature of the AM to PM operation, in which a stronger signal typically dominates.

A higher frequency product (i.e. 68 kHz in this example), may be a preferred one, as it is more effectively suppressed in the low-pass characteristics of the ADPLL relating its output phase to the FREF phase at its input.

The FREF Source

The FREF source, which is the victim of the interference in this model, is represented as a phase-modulation (PM) source, due to its conversion of additive interference, which may be represented as voltage/current, into phase-perturbations. A simple linear proportion factor α is assumed between the output phase and the input entity in this model, although a higher order dependency is also conceivable.

The transition intervals in the FREF signal, having short durations (e.g., 50-500 ps), may be regarded as sampling intervals, since only the interference induced during such intervals may impact the threshold crossing instance within it, thereby inducing a parasitic phase perturbation. At instances away from these transition intervals, the FREF signal would not be impacted by the interference signal, contrary to scenarios of linear addition. For this reason, in the model illustrated in FIG. 6, the waveform at the output of the 26 MHz source is a train of impulses r(t) 224, representing the sampling instances. These ideal impulses are input to a shaping filter 226, whose time-limited impulse response p(t) roughly corresponds to the duration of the rising edge in the FREF clock. The impulse response p(t) waveform represents the AM to PM conversion gain along that rising edge, which is naturally zero before the rising edge starts and after it is over, and may be high only during a very short interval around the threshold crossing in the rising edge (i.e. the pulse duration will not necessarily be equal in duration to the rise/fall time in FREF). The shaped pulses $r_p(t)$ 228 are then fed into a multiplier 250 where they sample the interference signal v(t) 236.

Since only the rising edges (or falling edges) in FREF are used to drive the ADPLL logic, the train of impulses, representing the interference opportunities, have a period of $T_s$=1/26 MHz=38 ns, rather than 1/52 MHz (19 ns).

AM to PM Conversion

Creation of Jitter

The affected signal b(t) 230 is responsible for the parasitic phase perturbations in the FREF signal, as shown in the interference model of FIG. 6. Therefore, the low frequency content in b(t) will determine the amount of parasitic phase perturbations on the CKV signal at the output of the ADPLL, as it would survive the low-pass filtering of the ADPLL closed-loop transfer function.

The AM to PM conversion occurs as the additive interference b(t) creates a proportional phase-shift or zero-crossing time-shift (i.e. instantaneous jitter) within the DCXO slicer, and/or within the digital gates, around the instance the FREF signal crosses the threshold level within the victim circuitry, expressed as θ(t)=α·b(t) 234.

Frequency Domain Representation and Creation of Low Frequency Interference

The train of impulses r(t) 224 in the time domain is equivalent, according to its well-known Fourier transform, to a train of Dirac functions in the frequency domain, separated by $f_S$=FREF=26 MHz in frequency (i.e. equal-power harmonics). The pulse shaping filter p(t) 226 may have a very narrow impulse duration (e.g., below 100 ps), which may be represented as a very wide low-pass filter in the frequency domain. A frequency-domain envelope representing this filter P(f) is to be applied, which could potentially have an effect around the frequencies of interest. For example, for a width of 250 ps, corresponding to a bandwidth in the order of 1/250 ps=4 GHz, the second harmonic of CKV≈2 GHz, could be impacted. This is of interest, since it has been shown that the second harmonic of the transmitter's carrier frequency is dominant in this interference mechanism, rather than the derivatives of CKV.

For a pulse duration well below 100 ps, we may assume $R_p(f)=R(f)·P(f)≅R(f)$ for f<10 GHz. The expression in Equation 7 below provides the time-domain and frequency domain representations of the train of impulses corresponding to the sampling instances. The gain factor is not of interest, but it is important to note the rich harmonic content in R(f), which is counterintuitive given the spectrally clean FREF sinusoid.

$$r(t) = \sum_{n=-\infty}^{\infty} \delta(t - n \cdot T_S) \xrightarrow{Fourier} R(f) = \frac{2\pi}{T_S} \sum_{n=-\infty}^{\infty} \delta(f - n \cdot f_S) \quad (7)$$

$$R_P(f) = R(f) \cdot P(f) = \frac{2\pi}{T_S} \cdot P(f) \cdot \sum_{n=-\infty}^{\infty} \delta(f - n \cdot f_S) \quad (8)$$

where $f_s$=FREF=26 MHz.

The harmonic of FREF closest to the interfering signal (e.g., 2×CKV, CKV, CKVD2, CKVD8, DSP clock) serves to downconvert it to a near-zero frequency (or zero, for the integer-N channel case). This applies to the CKVD8 interference source when the integer ratio N is an integer multiple of eight, as is the case for the "super integer" channel CKV=1872 MHz, since then the CKVD8 clock frequency is at a harmonic of FREF.

The interference signal v(t) 236 in this case may be represented as follows.

$$v(t) = \sum_{k=1}^{L} A_k \cdot \cos\{2\pi m_k f_S t + \varphi_k(t)\} \xrightarrow{Fourier} |V(f)| \quad (9)$$

$$= \sum_{k=1}^{L} V_k(f)$$

$$= \sum_{k=1}^{L} \tilde{A}_k \cdot C_k(f - m_k f_S)$$

$C_k(f)$ represents the magnitude-normalized spectrum of the modulated harmonic $m_k$. For example, those components in the summation in Equation 9 for which $m_k$=2×N, represent the interference sources at the carrier's second harmonic at 2×CKV (e.g., those originating from the current surges in the TX and CKV dividers).

L represents the total number of interfering components located at harmonics of FREF represented by the integers $\{m_k\}$ (k=1, 2 ... L). The sums in Equation 9 accommodate the possibility $m_j=m_k$ for j≠k, which would apply for independent sources of interference centered at the same FREF harmonic (e.g., from different circuits creating independent interference at a specific derivative or harmonic of CKV).

The frequency representation given in Equation 9 as a sum of spectra $V_k(f)$ illustrates that the total interference may be represented as L byproducts of the modulated carrier which are located at various harmonics of FREF having the appropriately compressed (for $m_k$<N) or expanded (for $m_k$>N) frequency deviations. It is noted that an expanded or compressed form of the modulated carrier's spectrum has a completely different appearance in the frequency domain, as it is the result of the Fourier transform of a frequency-modulated signal with a different modulation factor (i.e. not a GMSK signal for $m_k$≠N).

As previously noted, for the values of the index k associated with the interfering components at the carrier frequency (i.e. at CKV), $m_k$=N, where N=$f_{carrier}$/FREF. In general, however, for some 1≤k≤L, $m_k$ may be greater than N. Based on laboratory observations, the dominant interferers of interest appear to be at the second harmonic of the carrier frequency, i.e. the $M^{th}$ harmonic, where M=2×N. Furthermore, as previously noted, there may be two identical values for different elements in the vector $m_k$ (i.e. $m_i=m_j$ for i≠j) since two different sources of interference at a specific harmonic may exist having independent amplitudes and phases (as is the case for the interfering signals from the separate TX and RX/CKV dividers).

In the expression of Equation 9, $\{A_k\}$ are the amplitudes of these modulated harmonics, and $\{\phi_k(t)\}$ are their time-variant phases. Despite the frequency synchronization between the interfering harmonics, they may arrive within the FREF circuitry at different phase shifts depending on the relative locations of the circuitry in which they are generated, and on their coupling mechanisms. Hence, the functions $\{\phi_k(t)\}$ satisfy the following relationships:

Synchronization of Frequency Modulation:

$$\frac{d}{dt}\varphi_n(t) = 2\pi \frac{m_n}{N} f_{dev}(t) \quad (10)$$

Phase Independence:

$$\varphi_n(t) = \Phi_n + 2\pi \frac{m_n}{N} \int_{t_0}^{t} f_{dev}(t) dt \quad (11)$$

$$= \Phi_n + \frac{m_n}{N} \cdot \varphi_c(t)$$

$$n = 1, 2 \ldots L$$

where $f_{dev}(t)$ is the frequency deviation experienced by the carrier as a result of the GMSK modulation of the transmitted data;

$\Phi_n$ is the initial phases for the $n^{th}$ phase trajectory $\phi_n(t)$ at an arbitrary initial instance $t_0$, to which all the phase trajectory functions $\phi_n(t)$ are to be referenced;

$\phi_c(t)$ is the phase trajectory of the RF carrier whose time derivative is the carrier's instantaneous frequency deviation;

This frequency deviation signal $f_{dev}(t)$ follows the Gaussian filtering applied to the modulating data and reaches the nominal peak values of approximately $\Delta f_{peak}$=max$\{f_{dev}(t)\}$=±68 kHz.

Since there are interference contributors within v(t) that are of frequencies other than CKV (i.e. the carrier frequency during high-band operation), the multi-frequency sum v(t) contains elements of different frequency deviation magnitudes $$\frac{m_n}{N} \cdot \Delta f_{peak}.$$

for CKVD8 clock, for example, this relative magnitude is $$\frac{m_n}{N} = \frac{1}{8}$$

e.g., for 1872 MHz, N=72, and m=9). Consequently, the product of this component resulting from its down-conversions to zero by the $m^{th}$ harmonic of FREF, has a different multiplying factor in its phase argument, thereby inhibiting its vector summation with the interfering components originating from the other modulated harmonics, centered at different frequencies, as explained in more detail infra.

The sampling operation, represented by multiplier 250 in the block diagram of FIG. 6, performs the following multiplication:

$$b(t) = r_p(t) \times v(t) \xrightarrow{Fourier} \quad (12)$$

$$B(f) = R_p(f) * V(f) \quad (13)$$

$$= \left[\frac{2\pi}{T_S} \cdot P(f) \cdot \sum_{n=-\infty}^{\infty} \delta(f - n \cdot f_s)\right] * \sum_{k=1}^{L} \tilde{A}_k \cdot C_k(f - m_k f_s)$$

The products of interest in the above frequency domain convolution are those resulting from the relocation of the spectra $C_k(f-m_k \cdot f_s)$ to zero, as for each $m_k$ there is a Dirac function in $R_p(f)$ satisfying $n=m_k$.

Specifically, for those values of k where $m_k=M$, the interfering signals at the second harmonic of the carrier frequency (e.g., from the current surges feeding the TX divider and from those of the CKV circuitry driven by the RX/CKV divider) will be down converted to zero by the $M^{th}$ harmonic of FREF within $R_p(f)$. The result of interest within B(f), which is around f=0, may be represented as the sum:

$$|\tilde{B}(f)| = \sum_{i=1}^{K} \tilde{A}_i \cdot |C_i(f)| \quad (14)$$

where
K<L represents the actual number of the interfering components of interest (at the second harmonic of the carrier frequency in this case);
$C_i(f)$ are the spectra for these interfering signals after their down conversion to zero;

In the time domain, the zero-centered interference product b(t) may be expressed as the sum of the time domain zero-IF down-converted signals as follows.

$$b(t) = \sum_{i=1}^{K} \tilde{A}_i \cdot \text{Cos}\{\varphi_i(t) + \Phi_i\} \quad (15)$$

Since the $\phi_i(t)$ phase trajectories considered here are only those originating from the interferers at the second harmonic of the carrier frequency, for all values of the index i, $\phi_i(t)$ may be replaced with $2 \times \phi_c(t)$, further simplifying the sum to the form:

$$b(t) = \sum_{i=1}^{K} \tilde{A}_i \cdot \text{Cos}\{2\varphi_c(t) + \Phi_i\} \quad (16)$$

$$= A_{total} \cdot \text{Cos}\left\{\int_0^t \omega_0(\tau) d\tau + \Phi_0\right\}$$

This type of trigonometric summation may be represented as a vector sum. In this case, all elements are phasors centered at f=0, having different amplitudes $A_i$ and different phases $\Phi_i$. It is noted that:

$$\omega_o(t) = \frac{d}{dt} 2\varphi_c(t) \neq \text{constant}, \quad \text{mean}\{\omega_0(t)\} = 0 \quad (17)$$

Therefore, the phasors in Equation 16 are not of constant frequency, but since they share the same time-varying phase $2\phi_c(t)$, or equivalently, the same instantaneous frequency, they may be summed in vector form.

Contrarily, a down-converted product of CKVD8, having a time varying phase of $\frac{1}{8}\phi_c(t)$, cannot be considered in this manner and added to this sum in vector form, since its instantaneous frequency deviation is divided by a factor of 8 in the divide-by-8 operation.

The sum of all K elements having identical instantaneous frequency is represented in Equation 16 as a single trigonometric function at a zero-IF frequency of instantaneous value $\omega_0(t)$ having the magnitude $A_{total}$ and the phase shift $\Phi_0$.

Impact of the Phase Shift $\Phi_0$ on the Interference Effect

Interestingly, the phase shift $\Phi_0$ in the expression for the interference signal b(t) in Equation 16 is of great importance, as it determines the impact of the interfering signal. Although it represents a fixed relative phase between the interference signal b(t) and the FREF victim, to which the interfering harmonics are frequency synchronized, it could determine the spectral content of b(t) due to the nonlinear trigonometric function in which it appears in Equation 16. A specific known case in which it would not have an effect on the spectral content, is for $\omega_0(t)=\beta$, where $\beta$ is a constant representing a fixed phase-slope. For this case, the expression in Equation 16 has the form of a tone centered at $\omega=\beta$ [rad/sec] as expressed below.

$$b(t) = A_{total} \cdot \text{Cos}\{\beta \cdot t + \Phi_0\} \quad (18)$$

For this case, the spectrum |B(f)| of the interfering signal will not be affected by the phase shift $\Phi_0$ as it is simply a Dirac function at $\omega=\beta$ in the frequency domain. The expression in Equation 18 would apply in the interference scenario whenever redundant data is transmitted, such as only '1's or only '0's, both of which result in a fixed frequency shift from the carrier. In such cases, the down converted interference results in a tone at double the 67.7 kHz frequency shift, i.e. $\beta=2 \cdot \pi \cdot 135.4=850.85$ k rad/sec.

The AM-to-PM conversion of this interfering tone within the FREF circuitry results in frequency modulation at the rate of 135.4 kHz, creating spurs at frequency distances that are integer multiples of this frequency around FREF. The level of these spurs, corresponding to the extent of interference, are unaffected by the phase shift $\Phi_0$ and hence such redundant modulation is not useful for the observation and investigation of the TX performance dependency upon the FREF-RF phase relationship.

It is further noted that as the FREF source undergoes the parasitic phase modulation described above, the down converting harmonic of it at 2×CKV or M×FREF may no longer be assumed to be a simple Dirac function. This is also the case for modulation with random data, for which the phase perturbations induced onto FREF would not be represented by a simple tone. This compound effect is neglected, however, in the analysis as it is weak compared to the intentional modulation present on the carrier and its harmonics. This signal-to-noise assumption becomes even more valid once the phase alignment $\Phi_0$ is properly tuned, thus minimizing the interference and maximizing the ratio between the desired and parasitic phase modulations on the carrier to achieve the optimal phase-error performance.

Vector Summation of the Interference Sources

Figure 7:
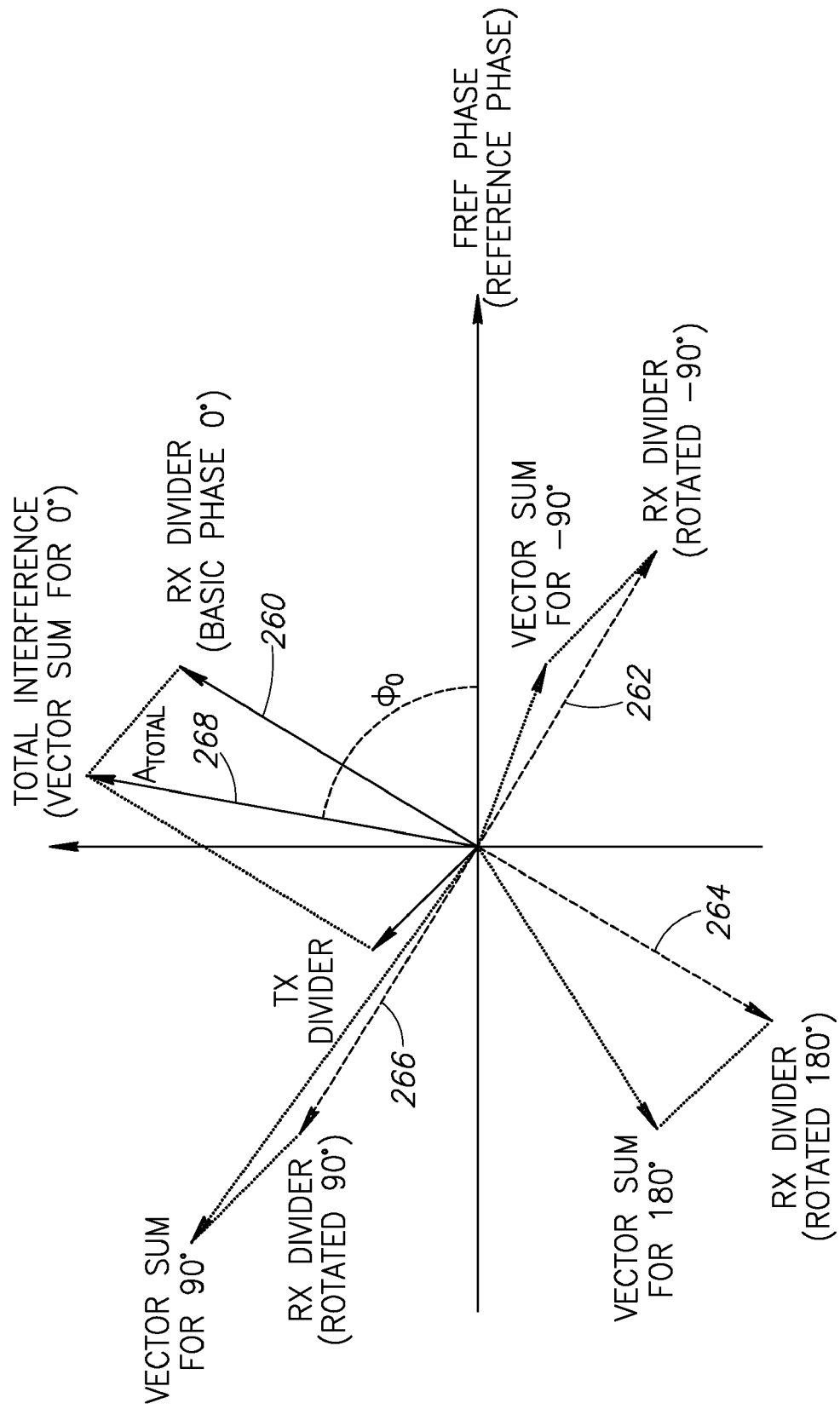
FIG. 7 is a vector diagram for multiple interference sources at the second harmonic.

A vector diagram for multiple interference sources at the second harmonic is shown in FIG. 7. This figure graphically illustrates the vector sum of expression Equation 15, where only two interference sources are assumed to be present, both of which share the same instantaneous frequency. The RX or CKV divider has four different orthogonal phases indicated as: vector 260 at basic phase 0 degree, vector 262 rotated −90 degrees, vector 264 rotated 180 degrees and vector 266 rotated 90 degrees, each of which may be selected to drive the TDC and the CKV based digital circuitry. Laboratory observations confirm that the magnitude of interference suffered at FREF, resulting in different levels of RMS PHE, is linked with this phase selection.

The vector diagram in FIG. 7 illustrates how a specific phase relationship between the interferences from the RX and the TX dividers, which is dictated by the values of the phase "biases" $\Phi_i$, can yield four different magnitudes for the total interference, depending on the selected phase for the RX divider. For each selected phase, the vector sum (vector 268) is not only different in magnitude but also in its phase relationship with FREF, which has been shown to affect the extent of degradation in RMS phase error (PHE) performance. The phase between the vector sum 268 and FREF, however, could be adjusted via software, allowing the minimization of the impact of this interference.

In FIG. 7, the vector sum having magnitude $A_{total}$ and phase $\Phi_0$, is shown for the case where the selected RX divider phase is 0 degrees. The lowest level of interference, and hence the preferable one, is clearly observed for the case where the −90 degree phase output of the RX divider is selected instead.

Spectral Analysis of the Parasitic Phase Perturbations θ(t)

It should be noted that due to the nonlinear nature of the trigonometric Cos function, the spectral content of b(t) may be very different from that of its phase argument function γ(t) expressed in Equation 19 below. As has been previously stressed, even the constant phase bias $\Phi_0$ within this function has an effect on the spectral content of b(t) and can shift spectral content around in the frequency axis while not affecting the total power in the signal b(t). This is in contrast to its effect within γ(t) itself, where only the DC level is affected while all other frequency content in γ(t) remains unaffected.

The phase relationships $\Phi_i$ of the multiple interferers (with respect to each other and FREF) determine the magnitude $A_{total}$ of the total interference b(t), as well as its phase $\Phi_0$. Both the magnitude and the phase of the interference impact transmitter performance. The amount of interference suffered is proportional to the magnitude of b(t), but is also dependent on its phase, since the spectral content is dependent on this phase, as previously explained, and when the spectrum of the interference is concentrated more within the loop bandwidth of the ADPLL, its potential impact is greater.

$$b(t) = A_{total} \cos\{2\phi_c(t) + \Phi_0\} = A_{total} \cos\{\gamma(t)\} \quad (19)$$

Figure 8:
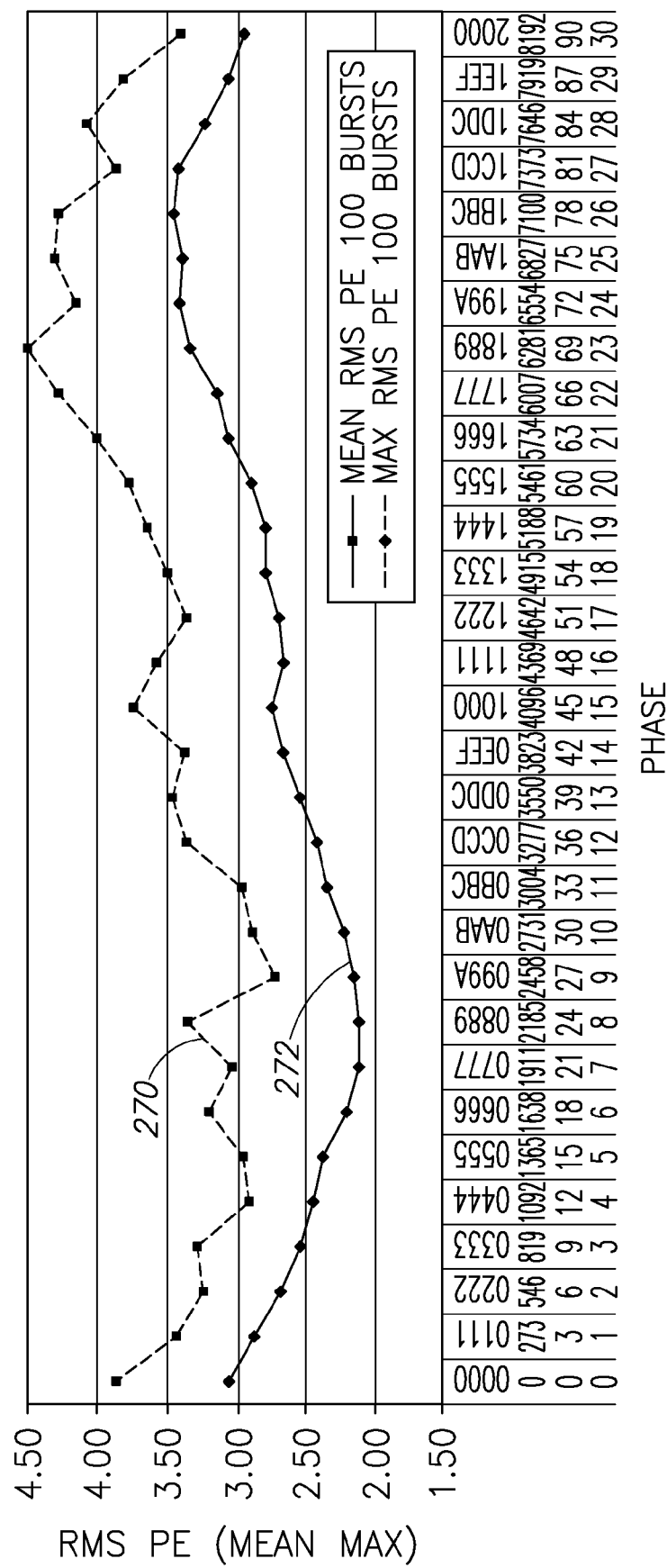
FIG. 8 is a graph illustrating the periodic characterization of the phase dependency.
Figure 9:
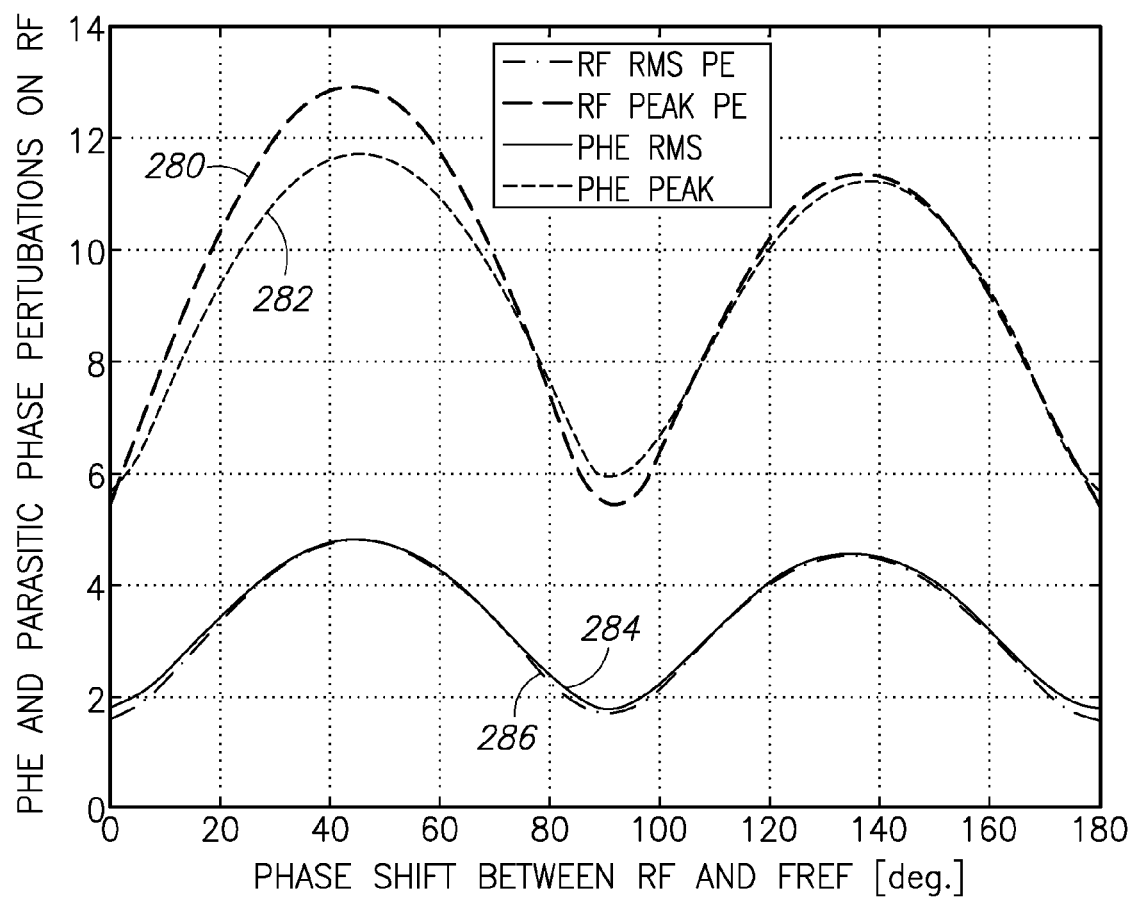
FIG. 9 is a graph illustrating the RMS and peak of interference and proportional jitter versus RF/FREF phase shift of an integer-N channel.

A graph illustrating the measured periodic characterization of the phase dependency is shown in FIG. 8. Trace 272 represents the mean RMS phase error for 100 GSM bursts, while trace 270 represents the maximum RMS phase error for 100 GSM bursts. A graph illustrating the theoretical RMS and peak of interference and proportional jitter versus RF/FREF phase shift is shown in FIG. 9.

Interference Minimization Mechanisms

Presented below is a description of how dithering of a relative phase shift $\Phi_0$ serves to minimize the impact of the interference by substantially pushing its spectral content outside of the ADPLL loop bandwidth. The use of intentional phase-perturbations induced onto FREF, serving for the purpose, will be described. The remedy to the interference problem is referred to as the hardware based dithering solution to the phase error problem as described in detail herein.

FREF Phase Dithering in a Variable Delay DCXO Buffer

First Embodiment

The spectrum R(f) of the hypothetical sampling signal r(t) in Equation 7 has been shown to be a series of Dirac functions centered at harmonics of the FREF frequency. This representation holds valid as long as the FREF signal carries no modulation, as is typically the case for a reference signal of a PLL. Once the FREF signal is purposefully frequency modulated with a phase-dithering signal, however, the sidebands of the resultant frequency modulation on the higher harmonic of it would be stronger by a factor of M (i.e. the ratio between the frequency of harmonic at M×FREF or 2×CKV, and the fundamental 26 MHz). Equivalently, the frequency deviation experienced by the $M^{th}$ harmonic of FREF is M times wider. For example, consider the integer channel 1872 MHz, where N=72 and M=144, a frequency deviation of 100 Hz on FREF translates to 14.4 kHz of deviation at a second harmonic of 1872 MHz. This 'amplified' deviation is down converted to around zero, where it is added onto the phase modulation existing on the second harmonic of the RF signal at 2×CKV.

For example, if the frequency-dithering signal being applied is a 2 MHz square wave of 100 Hz magnitude (i.e. the equivalent extent of the FM amplitude), then the phase dithering signal is a triangular wave amplified by a factor of M, which is summed with the phase modulation signal $2 \times \phi_c(t)$ as it is being down-converted to zero.

In accordance with the invention, since the interfering signal can be represented by the nonlinear trigonometric transfer function given above, the addition of the dithering signal results in intermodulations that effectively push a great portion of the interference energy outside of the frequency band of interest.

FREF Phase Dithering in a Variable Delay DCXO Buffer

First Embodiment

Figure 10:
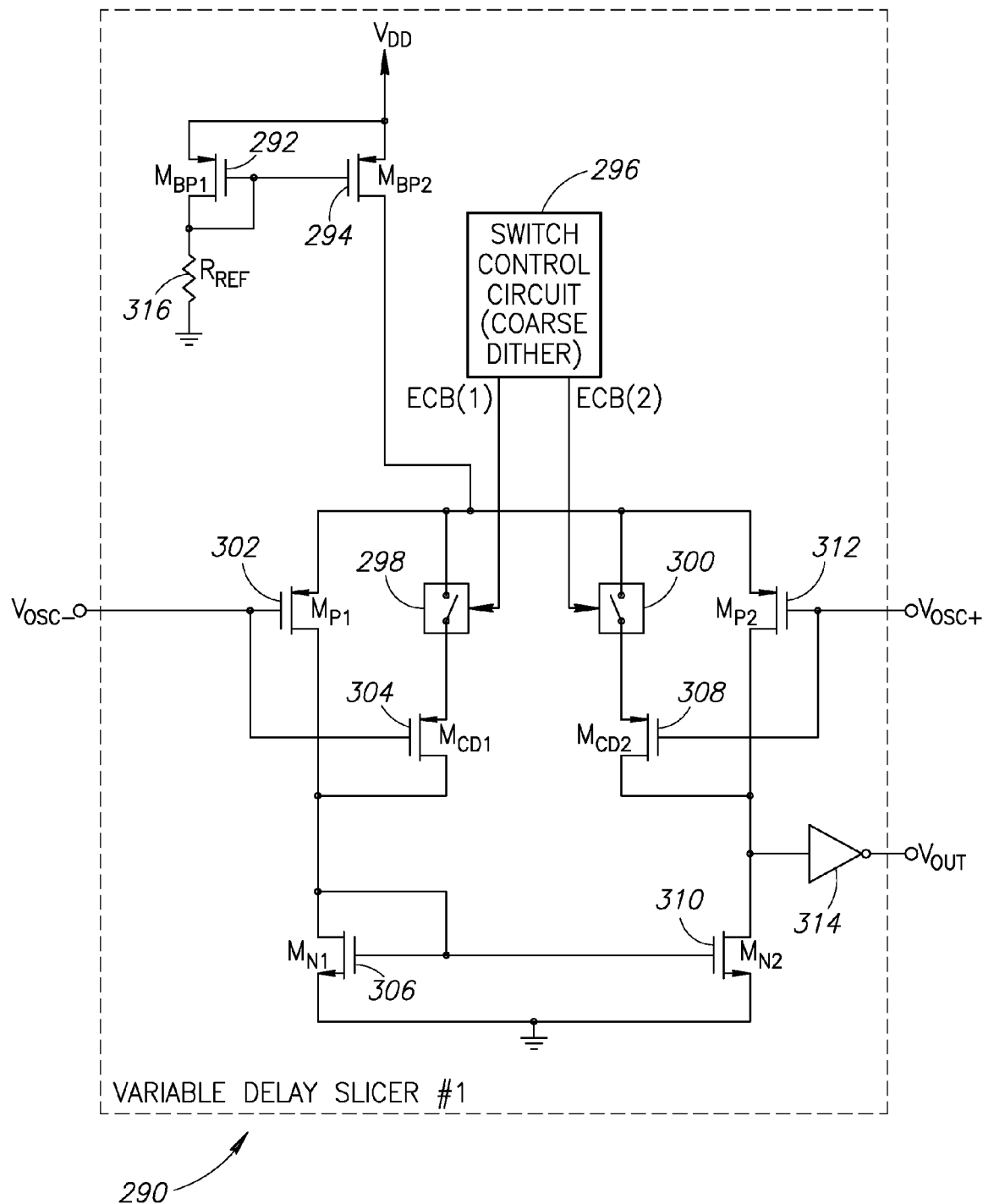
FIG. 10 is a schematic diagram illustrating a first embodiment of the variable delay slicer mechanism of the present invention.

A schematic diagram illustrating a first embodiment of the variable delay slicer mechanism of the present invention is shown in FIG. 10. The variable delay slicer, generally referenced 290, comprises a mirrored PMOS current source coupled to a PMOS differential input pair to form a differential circuit. The reference current for the current mirror 294 is generated through on-chip resistors. The current mirror comprises transistor $M_{BP1}$ 292 in series with resistor $R_{REF}$ 316 for generating the reference current and transistor $M_{BP2}$ 294 for mirroring it. The differential input pair comprises transistor $M_{P1}$ 302 whose gate is connected to one end of the differential frequency reference output from the DCXO $V_{OSC-}$ $V_{osc-}$, and transistor $M_{P2}$ 312 whose gate is connected to the other end of the differential frequency reference output from the DCXO $V_{OSC+}$. The slicer also comprises load NMOS transistors $M_{N1}$ 306 and $M_{N2}$ 310, and inverter 314. Note that for purposes of the invention, the order of the connections to the outputs ($V_{OSC+}$, $V_{OSC-}$) of a preceding oscillator to the inputs of the differential pair of the slicer is not critical to operation of the slicer circuit.

In accordance with the invention, variable delay generation in coarse steps is performed through intentional offset generation at the differential pair ($M_{P1}$ and $M_{P2}$) by adding a transistor in parallel to each input device. Specifically, PMOS transistor $M_{CD1}$ 304 in series with switch 298 is connected in parallel to $M_{P1}$. Similarly, transistor $M_{CD2}$ 308 in series with switch 300 is connected in parallel to $M_{P2}$. Transistors $M_{CD1}$ and $M_{CD2}$ are alternately turned on and off based on a digital coarse control sequence (such as a dithering sequence) applied to switches 298 and 300, respectively. The digital control sequence comprising Coarse Control Bit 1 and Coarse Control Bit 2 (CCB(1) and CCB(2)) is generated by the switch control circuit 296 or other suitable sequence generation circuit, e.g., sigma-delta modulator, etc. Preferably, only one of these two switches is on at any point in time.

The variable delay generation in coarse steps is intended to alleviate the impact of the transmit RF output signal coupling. It is achieved through the intentional generation of an input-referred voltage offset in the differential input pair by the addition of a transistor in parallel with each input device. Dithering applied to the two control bits (i.e. CCB(1) and CCB(2)) creates the voltage offset. The dithering is applied to the digital control bit sequence via the switch control circuit 296.

In the ideal case, the two differential input devices have equal strength with maximum voltage gain occurring around zero differential input voltage. A mismatch is introduced via the addition of the voltage offset created when one of the switches 298, 300 is turned on activating one of the parallel transistors $M_{CD1}$ and $M_{CD2}$. This causes the slicer to shift the location of the rising and falling transition points of its digital output voltage $V_{OUT}$ for that cycle of the reference frequency. Converting the offset from the sinusoidal or near-sinusoidal input to the time domain, either creates a time lead or lag in the resultant digital clock output. The asymmetry in the circuit is attributable to the diode connected configuration at $M_{N1}$. The gain from the gate of $M_{P1}$ ($V_{OSC-}$) to its drain is lower than the comparable gain at $M_{P2}/M_{CD2}$ since $M_{N2}$ is a non-diode connected transistor whereas $M_{N1}$ is. Thus, the impedance at those nodes is different which leads to the inherent asymmetry in the circuit.

Figure 11:
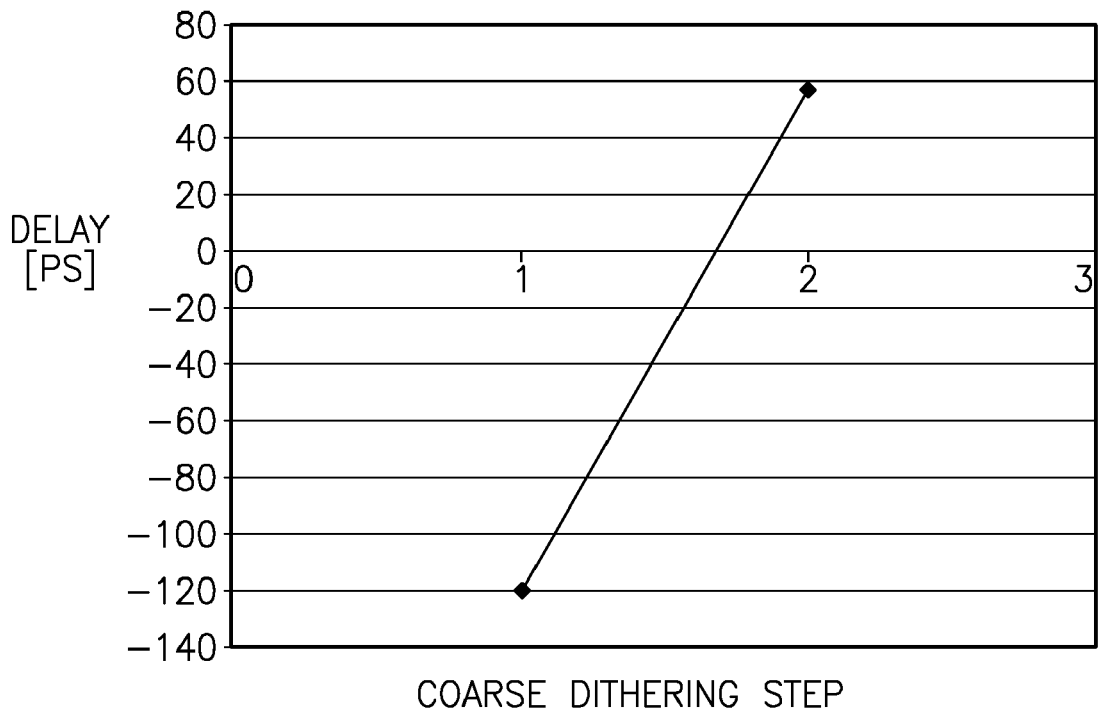
FIG. 11 is a graph illustrating the simulated delay variation at the rising edge with coarse dithering steps in the slicer.
Figure 12:
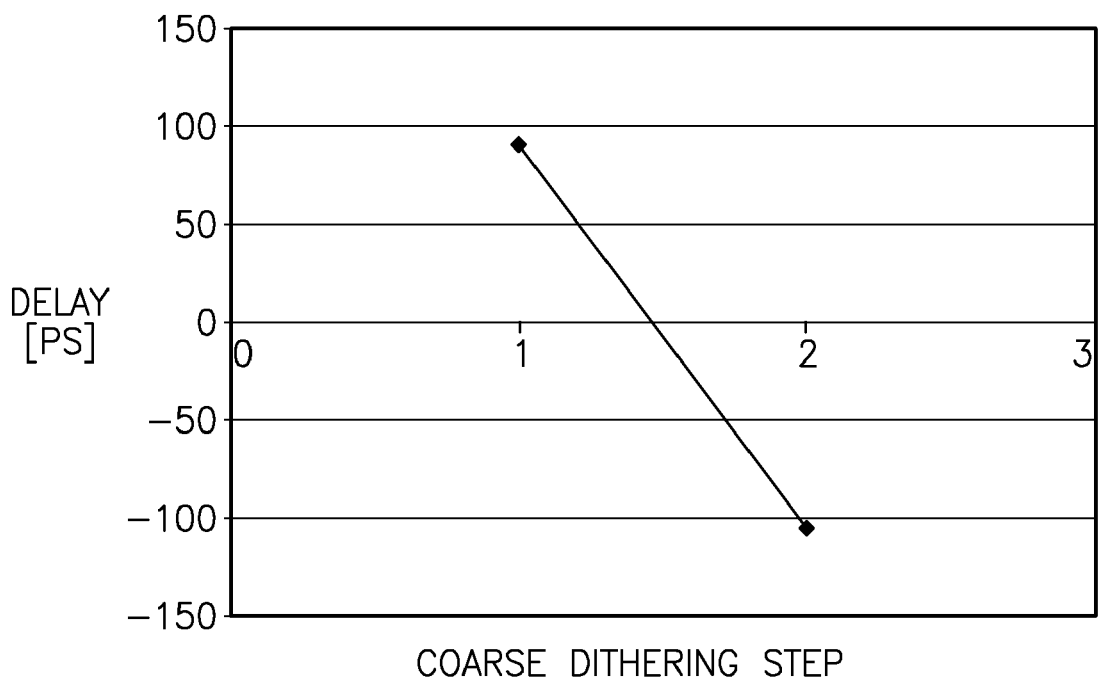
FIG. 12 is a graph illustrating the simulated delay variation at the falling edge with coarse dithering steps in the slicer.

The variation in simulated delay at the rising edge of the TDC clock with coarse dithering steps is shown in FIG. 11. The reference point with respect to which the step size in delay is calculated is the case of both switches being turned off. Coarse dithering step 1 corresponds to CCB(1) activating and CCB(2) deactivating their corresponding switches. Coarse dithering step 2 corresponds to the opposite case. The simulated delay at the falling edges of the TDC clock with the same steps is shown in FIG. 12. Note that in both FIGS. 11 and 12, the case of both switches being activated is an unused state.

Figure 13:
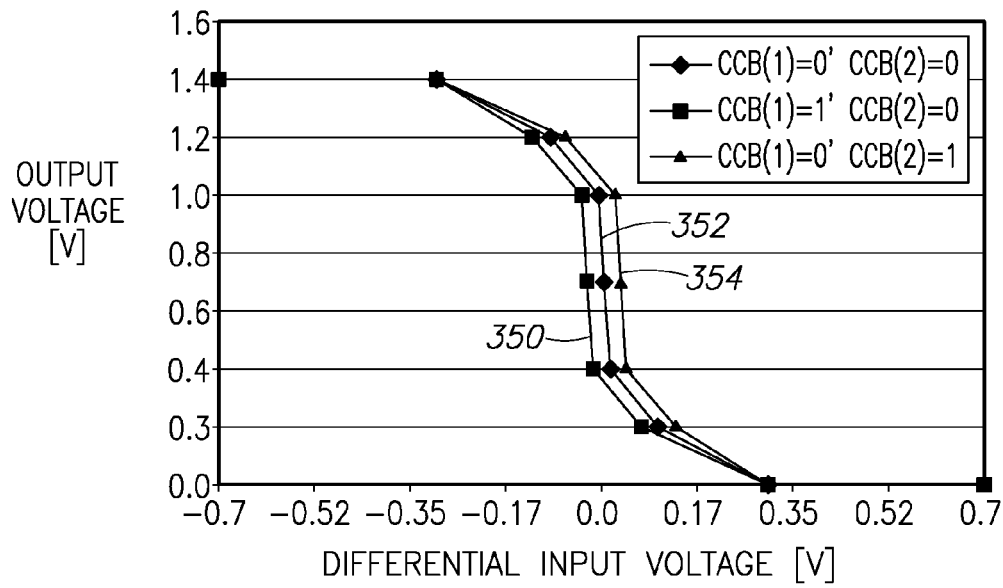
FIG. 13 is a graph illustrating the slicer DC transfer curve with coarse dithering.

A graph illustrating the slicer DC transfer curve with coarse dithering is shown in FIG. 13. Curve 352 represents the DC transfer curve for both switches in the off state. Turning on switch 298 (FIG. 10) via CCB(1) causes additional current to flow through the corresponding left side of the differential pair. This results in a lead in the output voltage as shown in transfer curve 350. Similarly, turning on switch 300 (FIG. 10) via CCB(2) causes additional current to flow through the right side of the differential pair. This results in a lag in the output voltage as shown in transfer curve 354. Note that the actual control signal sequence applied to the two coarse control bits is generated by a coarse dither circuit described in connection with FIG. 19 infra.

Figure 14:
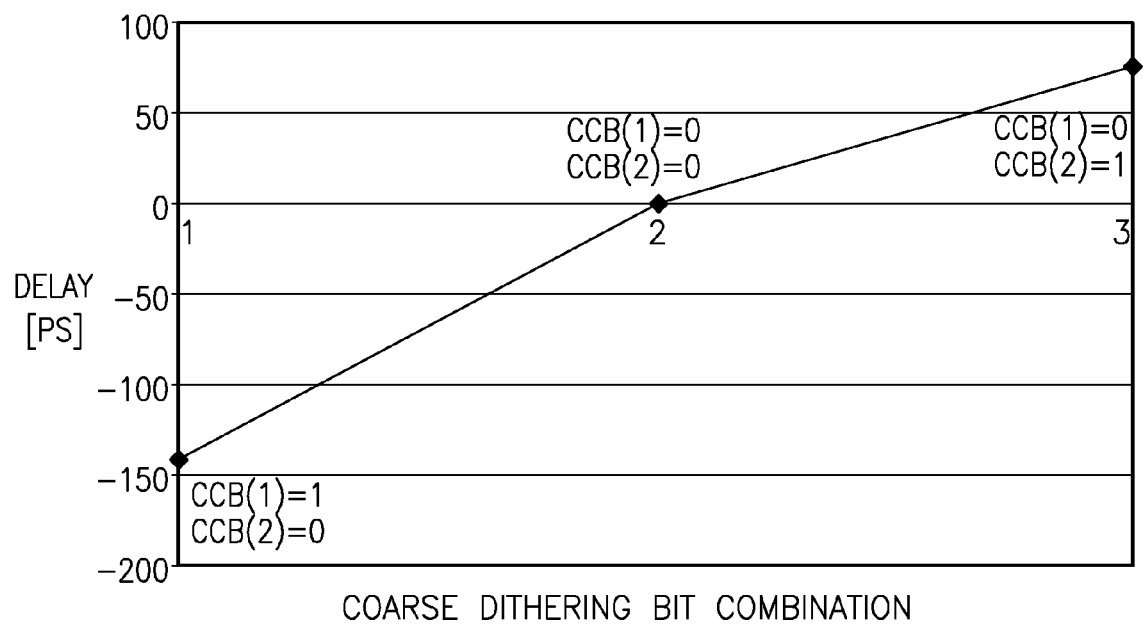
FIG. 14 is a graph illustrating the slicer input to output delay variation with coarse dithering.

A graph illustrating the slicer input to output delay variation with coarse dithering is shown in FIG. 14. The delay for CCB(1)='0' and CCB(2)='0', corresponding to both transistors 304, 308 remaining off, is taken as the reference point, with respect to which the delay variations in the other valid cases are calculated. A lead (negative delay) of approximately 150 ps results with CCB(1)='1' and CCB(2)='0'. A lag (positive delay) of approximately 75 ps results with CCB(1)='0' and CCB(2)='1'.

The current mismatch in the differential input pair in the slicer causes the reference frequency (FREF) clock signal to go in and out of integer multiples of the transmit RF output signal in a random manner. The dithering of the FREF randomizes and moves the zero crossings of the frequency reference source such that when the TX RF output coupling aligns at what used to be an integer multiple in frequency, the alignment does not happen in the same spot. The randomization effectively reduces the occurrences of the alignment whereby the TX RF output frequency is an integer multiple of the frequency reference.

FREF Phase Dithering in a Variable Delay DCXO Buffer

Second Embodiment

Figure 15:
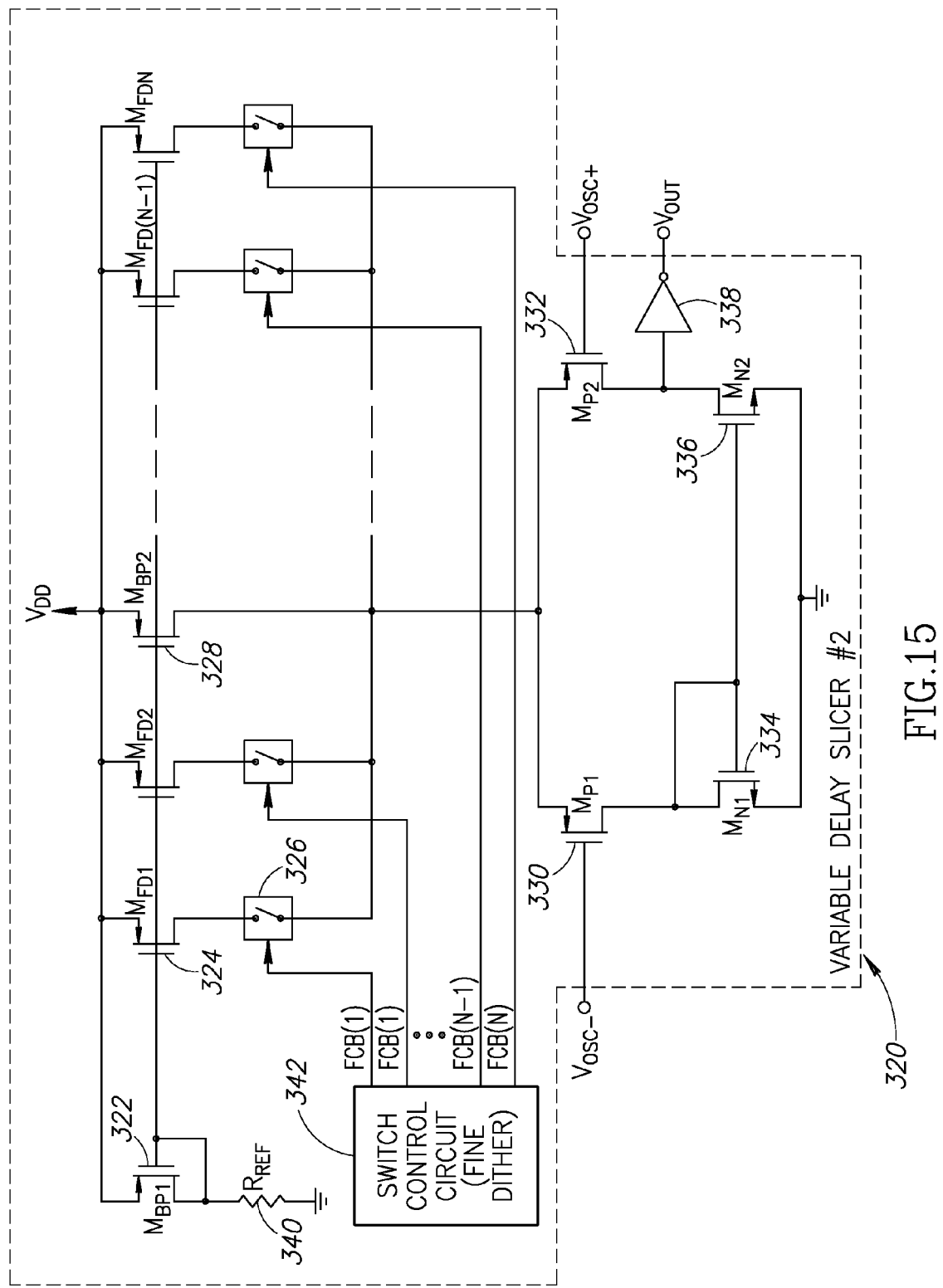
FIG. 15 is a schematic diagram illustrating a second embodiment of the variable delay slicer mechanism of the present invention.

A schematic diagram illustrating a second embodiment of the variable delay slicer mechanism of the present invention is shown in FIG. 15. The variable delay slicer, generally referenced 320, comprises a differential pair with PMOS input devices and is biased through a PMOS current mirror with its reference current generated through on-chip resistors. The current mirror comprises transistor $M_{BP1}$ 322 in series with resistor $R_{REF}$ 340 for generating the reference current and transistor $M_{BP2}$ 328 for mirroring it. The current mirror also comprises additional transistors 324, labeled $M_{FD1}$ through $M_{FDN}$, each in series with a respective switch 326. The differential input pair comprises transistor $M_{P1}$ 330 whose gate is connected to one end of the differential frequency reference output from the DCXO $V_{OSC-}$, and transistor $M_{P2}$ 332 whose gate is connected to the other end of the differential frequency reference output from the DCXO $V_{OSC+}$. The slicer also comprises NMOS transistors $M_{N1}$ 334 and $M_{N2}$ 336 and inverter 338.

The inputs to the slicer are the differential outputs (i.e. $V_{OSC+}$ and $V_{OSC-}$) of the DCXO core. In addition, the slicer comprises a single-ended output driving a chain of inverters (represented by single inverter 338 for clarity sake) buffering the DCXO clock. The clock output of the slicer in the example ADPLL presented herein is input to the TDC 206 (FIG. 5) of the ADPLL or it could be input to a phase detector in other embodiments. It is noted that the variable delay slicer mechanism for generating the delay in fine steps can be applied to the ADPLL circuit of FIG. 5 to alleviate the impact of the finite resolution of the TDC.

The fine dithering mechanism in this slicer embodiment is intended to vary the delay of the DCXO clock by modifying the mirroring ratio of the PMOS current mirror biasing the differential pair. The delay in the slicer output clock signal (i.e., which is input to the TDC) is varied by changing the bias current of the differential pair buffer in small steps. This is achieved by varying the mirroring ratio by adding more PMOS transistors 324 in parallel. A fine dithering sequence is applied to the fine control bits, Fine Control Bit 1 through Fine Control Bit N (FCB(1) through FCB(N)) to achieve the change in the bias current of the differential pair.

Figure 16:
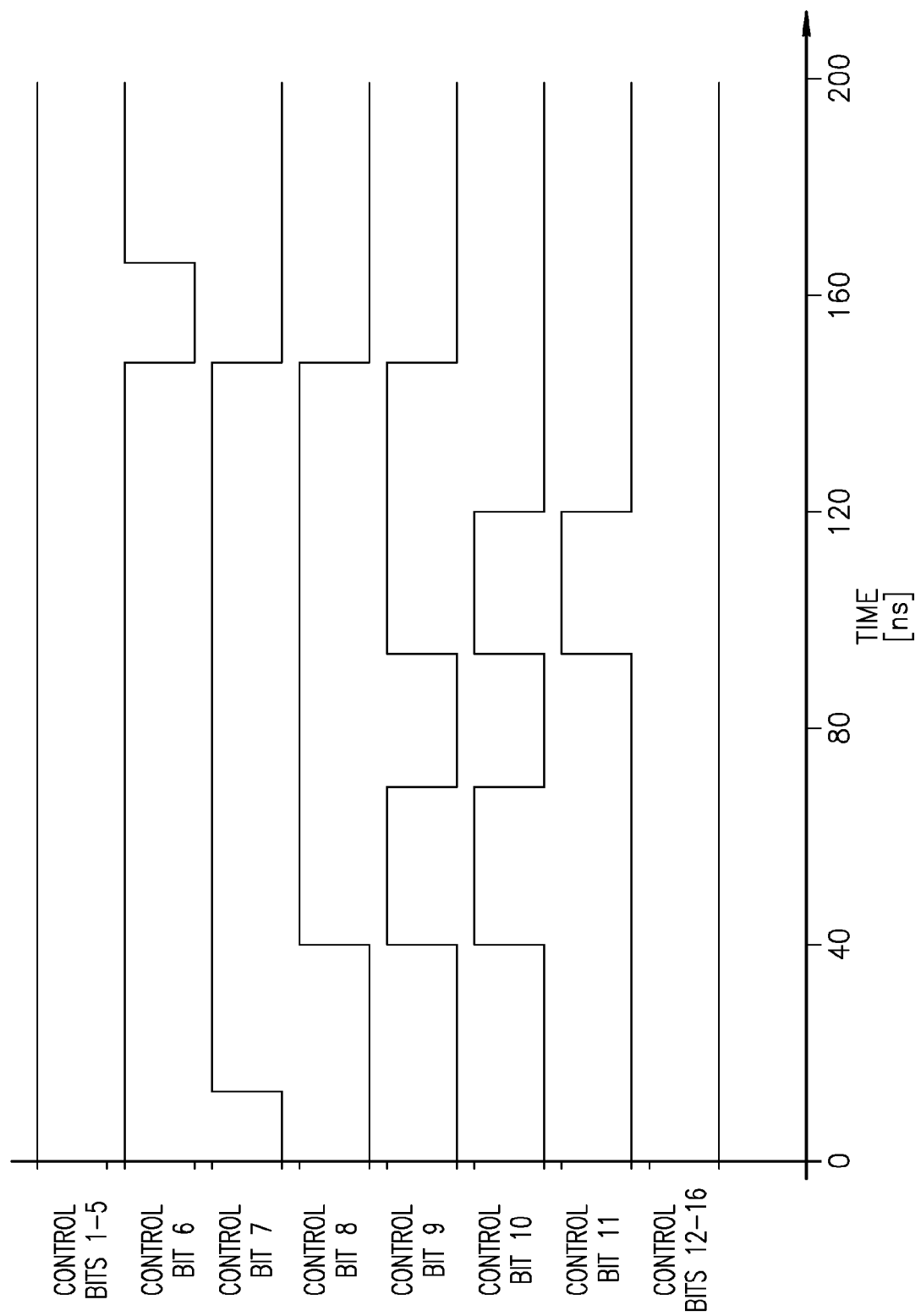
FIG. 16 is a graph illustrating an example fine dithering pattern applied to the control bits in the current mirror.

A graph illustrating an example fine dithering pattern applied to the control bits in the current mirror is shown in FIG. 16. In this example, the number N of fine control bits is 16. It is appreciated that N=16 is used for example purposes only and that any number of control bits may be used. The actual control signal sequence applied to the 16 fine control bits is generated by a fine dither circuit described in connection with FIG. 20 infra.

Figure 17:
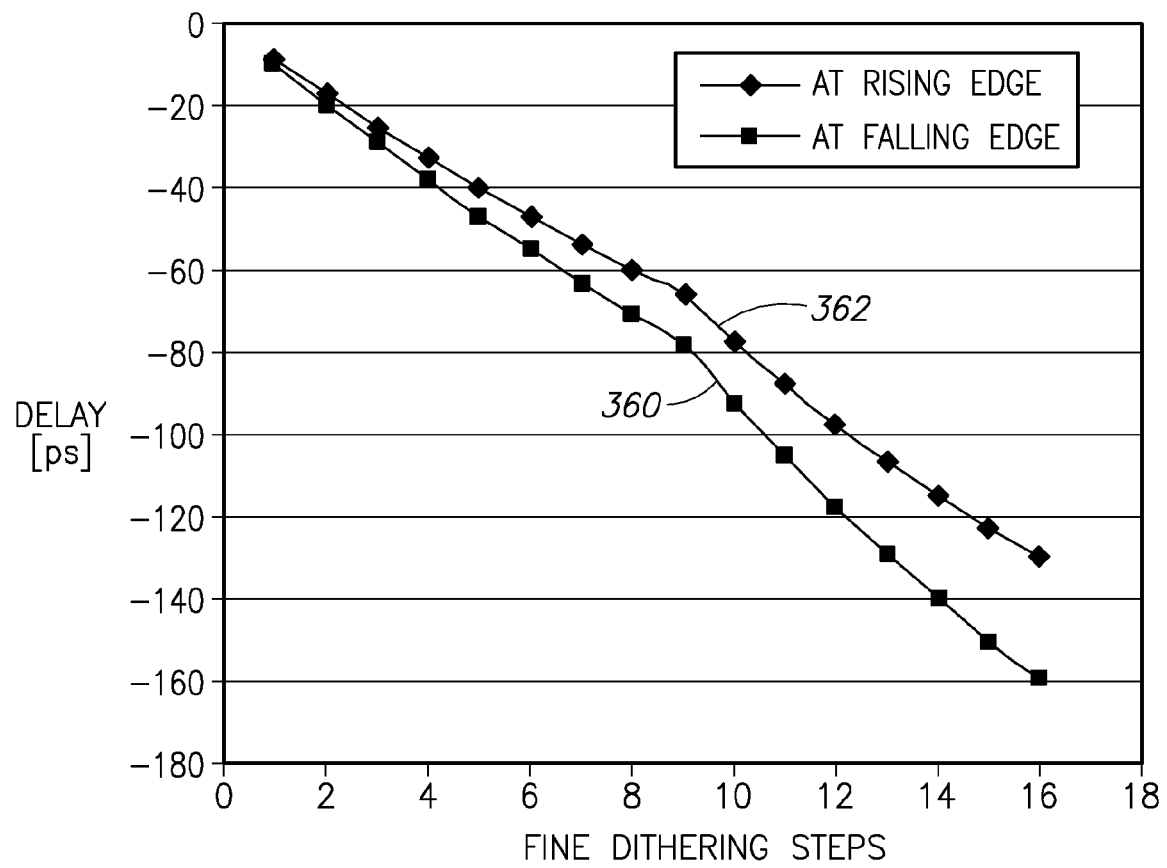
FIG. 17 is a graph illustrating the slicer delay variation with fine dithering steps.

Note that the delay of interest in this circuit is that from the input of the differential pair (i.e. the input signals denoted as $V_{osc+}$ and $V_{osc-}$) to the output of the inverter chain (the output signal denoted as $V_{OUT}$). Any number of transistors 324 may be used to achieve any desired resolution granularity. In the example circuit implementation presented herein, 16 transistors 324 are used in thermometer code fashion providing for 16 delay steps. The simulated delay variation with fine dithering steps is shown in FIG. 17. Curve 360 represents the delay variation at the falling edge of the input while curve 362 represents the delay variation at the rising edge. As the fine dithering bits turn the switches on, thereby increasing the mirroring ratio and hence the bias current of the differential pair in small increments, the clock latency decreases as expected. The dithering applied to the current mirror is controlled by the switch control circuit 342 which generates the appropriate signals Fine Control Bit 1 through Fine Control Bit N (FCB(1) through FCB(N)) that are applied to the switches 326, respectively. The level of dithering can be 'tuned' by adjusting either up or down the value of the digital control sequence generated by the switch control circuit and applied to the switches 326.

Applying a coarse dithering signal to the differential pair (see FIGS. 10 and 18) significantly reduces the effects of the interference caused by coupling of the transmit RF signal back to the frequency reference input in the manner as described supra in connection with the first slicer embodiment.

Thus, the principle of the present invention, is that the interfering RF signal is sampled by the FREF slicer, such that it is effectively downconverted to zero-IF (or near-zero-IF if the interfering signal is modulated, for example). There, at low frequencies, it is translated into low-rate jitter that passes through the low-pass characteristics of the low pass transfer function of the ADPLL (i.e. from FREF phase to RF phase). By adding an additional high-frequency dithering signal in the slicer, and thus dominating the jitter on the clock signal and bringing it into higher frequencies where the low-pass response of the ADPLL is able to suppress it, the noticeable impact on the RF jitter (i.e. phase distortions) is significantly reduced. In particular, it is the frequency translation and/or compression characteristic of the non-linear voltage domain transfer function response of the slicer that is responsible for the desensitization of the ADPLL to the RF interfering signal.

Coarse Dither Generation

Figure 19:
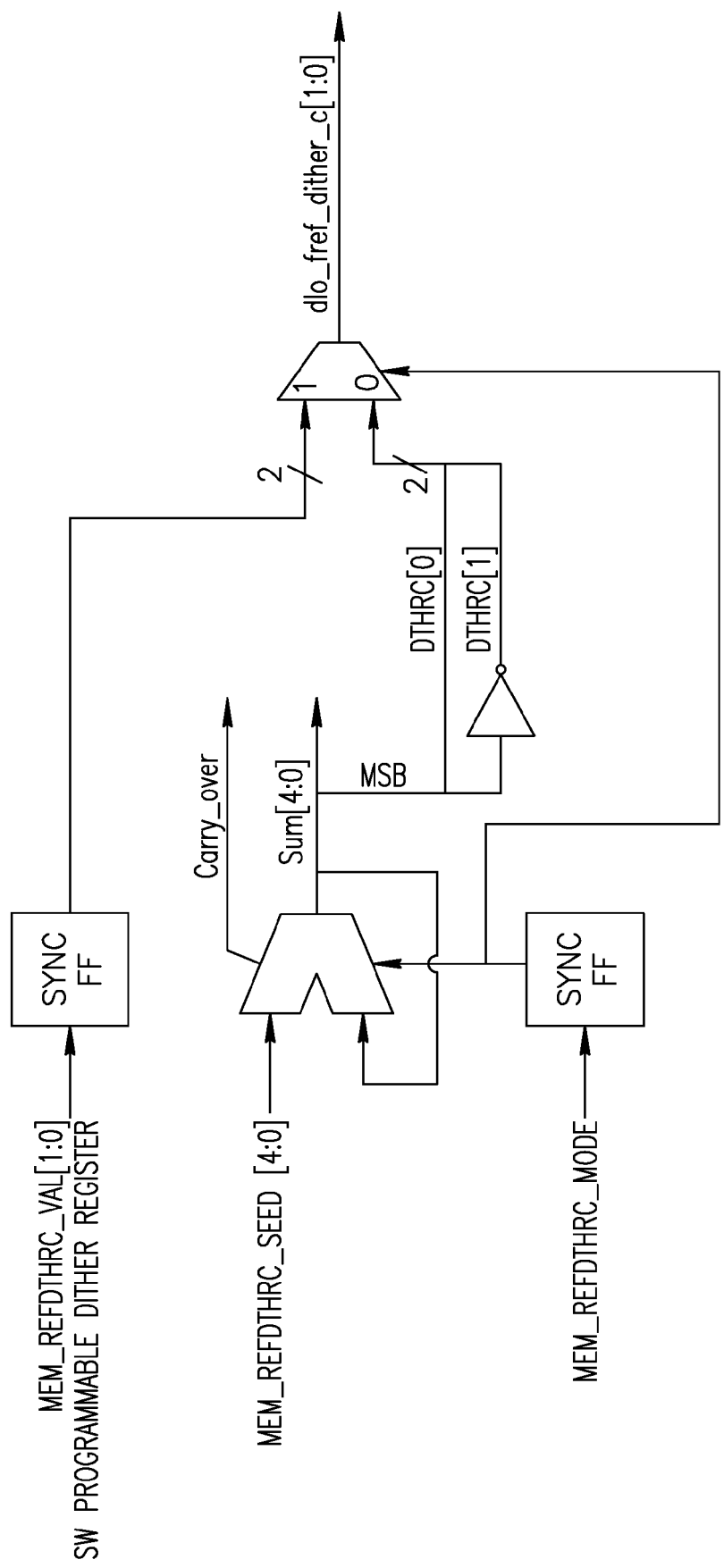
FIG. 19 is a block diagram illustrating the coarse dither switch control circuit in more detail.

A block diagram illustrating the coarse dither switch control circuit in more detail is shown in FIG. 19. The coarse dithering addresses problem of RF coupling onto the digitally controlled crystal oscillator (DCXO) or its buffer. The coarse dither signal applied to the RF coupled frequency reference signal desensitizes the FREF signal from RF coupling. Further, the frequency of the coarse dither is high compared to the loop bandwidth of the ADPLL. Therefore, the interference applied is largely filtered out by the ADPLL loop filter.

In operation, the coarse dither signal comprises a square wave signal with controllable frequency. In one example embodiment, it is implemented with a $1^{st}$ order $\Sigma\Delta$ modulator structure with a 5-bit accumulation stage. The input DC value to the $\Sigma\Delta$ controls the frequency of the square wave. In conventional $\Sigma\Delta$ the output is the carry over bit, however, in this case the dither bit is the MSB of the residue. The MSB of the residue has 50% duty cycle for power of two inputs. For example, an input of $2^{(5-p)}$ yields a dither frequency of FREF/$2^p$ with 50% duty cycle. For a 5-bit implementation of $\Sigma\Delta$ the range of achievable frequency is FREF/2 to FREF/$2^5$. Small duty cycle variations can be obtained with non-power of two inputs. The carry over bit is maintained for future use.

Fine Dither Generation

Figure 20:
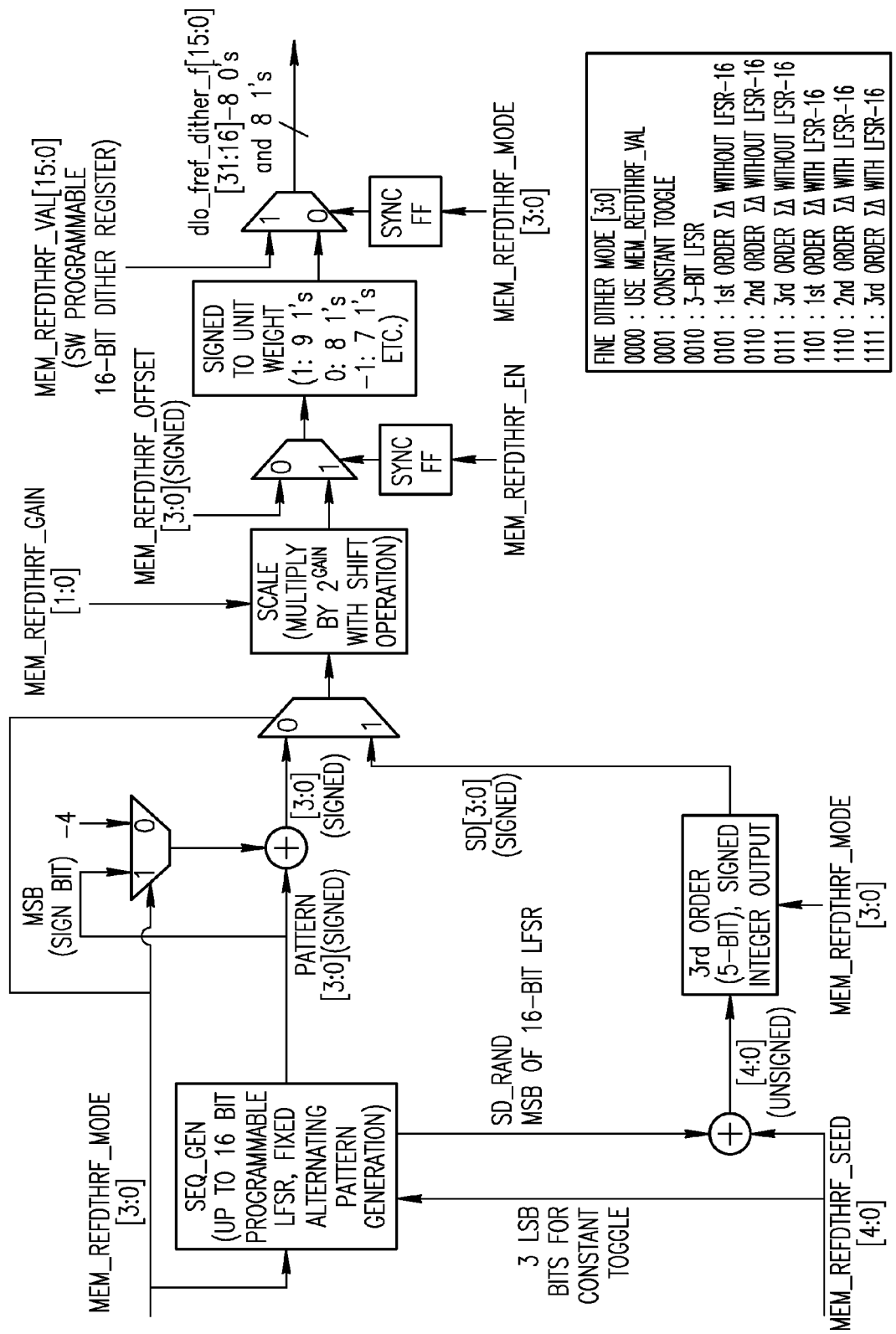
FIG. 20 is a block diagram illustrating the fine dither switch control circuit in more detail.

A block diagram illustrating the fine dither switch control circuit in more detail is shown in FIG. 20. Fine dithering is primarily applied to integer channels to improve RMS phase error due to TDC or phase detector quantization noise. For integer channels, the TDC quantization noise can cause wide range of RMS phase error depending on the initial state of ADPLL. Dithering ensures that the TDC is kept busy enough so that CKV clock edges are not trapped in TDC dead zones. The dithering mechanism can be characterized into two categories: (1) a short periodic pattern; and (2) a random sequence with noise shaping.

Noise injected at the TDC is low pass filtered by the ADPLL loop transfer function. It is desirable that the dither sequence has less low frequency content. Short periodic sequences are thus preferable since there is no energy near DC. The only frequency content is at the fundamental frequency and at its harmonics and periodicity being short puts these harmonic frequencies farther away. If the dither amount is large enough due to high dither resolution step sizes, however, the harmonic frequencies may appear in the ADPLL output spectrum. In this case, a random noise shaped sequence may be more desirable. It has been found that when the system has low noise, a random noise shaped sequence performs better when compared to a shaped-noisy system. Therefore, both kinds of dithers are accommodated to combat different system scenarios. In the case of a reasonably noisy ADPLL system, however, the short periodic pattern has been found to yield better performance.

FREF Phase Dithering in a Variable Delay DCXO Buffer

Third Embodiment

Figure 18:
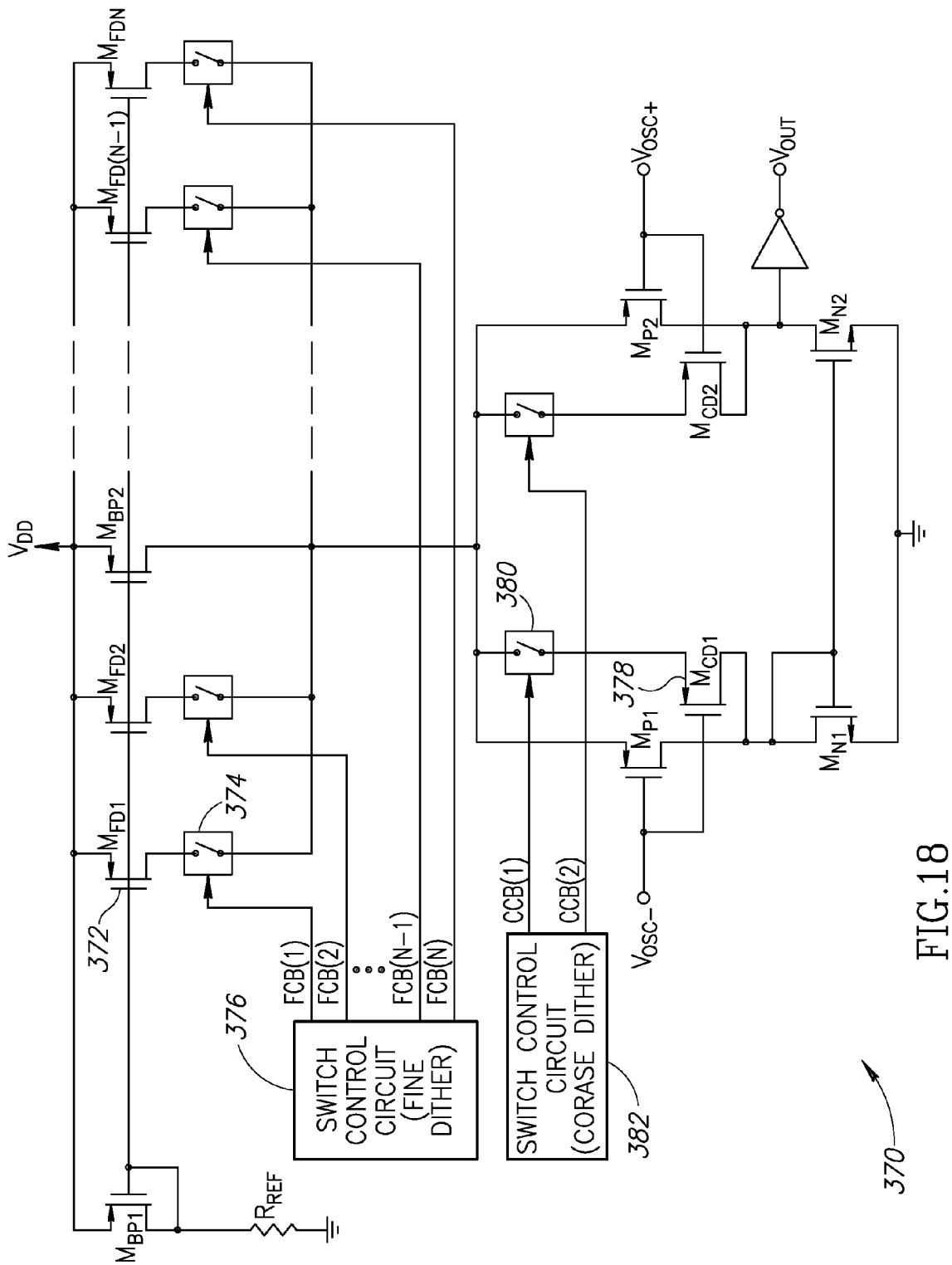
FIG. 18 is a schematic diagram illustrating a third embodiment of the variable delay slicer mechanism of the present invention that combines the coarse and fine dithering into a single circuit.

In a third variable delay slicer embodiment, the first and second embodiments described supra are combined into a single circuit. A schematic diagram illustrating a third embodiment of the variable delay slicer mechanism of the present invention that combines the coarse and fine dithering into a single circuit is shown in FIG. 18.

In this combined embodiment, the variable delay slicer circuit, generally referenced 370, comprises the differential pair with controllable offset of FIG. 10 and the current mirror circuit of FIG. 15. Separate switch control circuits generate the switch sequence for the switches in the current mirror and in the differential pair portions of the circuit. In particular, coarse dither switch control circuit 382 functions to provide the coarse dither control via coarse control bits CCB(1) and CCB(2) coupled to the two switches 380. Each switch 380 controls one of the transistors 378 ($M_{CD1}$ and $M_{CD2}$). Fine dither switch control circuit 376 functions to provide the fine dither control via fine control bits FCB(1) through FCB(N) coupled to switches 374. Each switch 374 controls one of the transistors 372 ($M_{FD1}$ through $M_{FDN}$).

RMS Phase Error Improvement

As described supra, the RMS phase error of the ADPLL is reduced by use of the frequency reference dithering mechanism of the present invention. To illustrate the improvement possible with the present invention, phase error measurements for an ADPLL based transmitter circuit are presented in FIGS. 21 and 22. Data for both cases of an ADPLL circuit with and without the variable delay slicer mechanism of the present invention is provided.

Measurements were performed for an ADPLL based GSM radio incorporating a slicer for both cases of with and without the frequency reference dithering mechanism of the present invention. Each measurement run comprised 200 GSM bursts wherein 100 runs were performed for three frequencies: GSM900 at 883.2 MHz (indicated by solid black); DCS1800 at 1766.4 MHz (indicated by gray shading); and PCS1900 at 1881.6 MHz (indicated by solid white). The measurements were also run over three temperatures: −20° C. (indicated by square shaped data points), 25° C. (indicated by circle shaped data points) and 85° C. (indicated by triangle shaped data points).

Figure 21A:
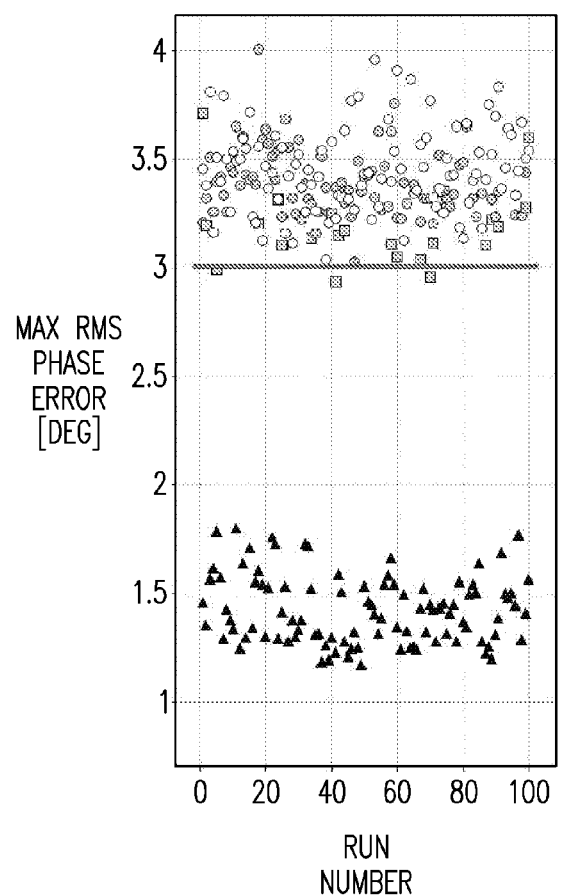
FIG. 21A is a graph illustrating the maximum RMS phase error achieved without the use of the mechanism of the present invention.

A graph illustrating the maximum RMS phase error achieved without the use of the mechanism of the present invention is shown in FIG. 21A. As indicated, virtually all test runs of DCS1800 and PCS1900 at −20 and 25 degrees result in maximum RMS phase error above three degrees, thus failing to meet the standard.

Figure 21B:
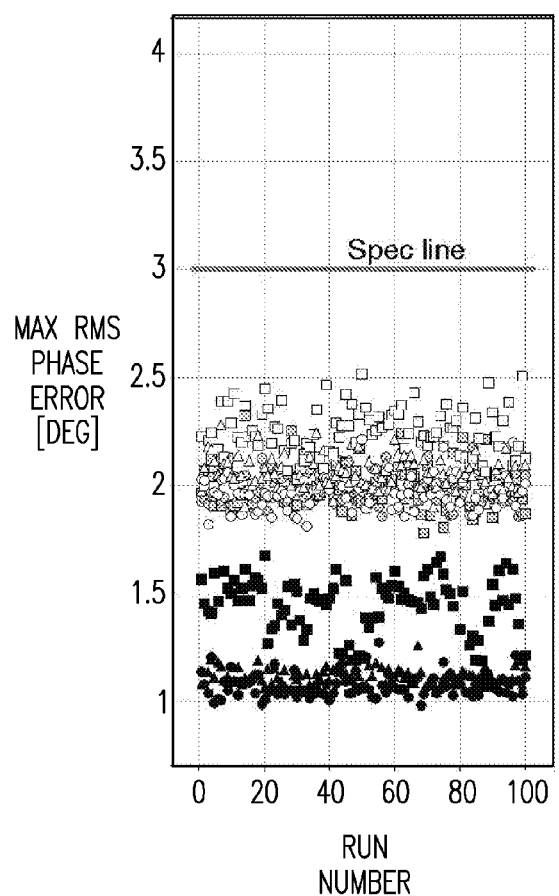
FIG. 21B is a graph illustrating the maximum RMS phase error achieved with the use of the mechanism of the present invention.

A graph illustrating the maximum RMS phase error achieved with the use of the mechanism of the present invention is shown FIG. 21B. As indicated, use of the dithering mechanism of the present invention enables all test cases to yield maximum RMS phase error of less than three degrees, well within the specification.

Figure 22A:
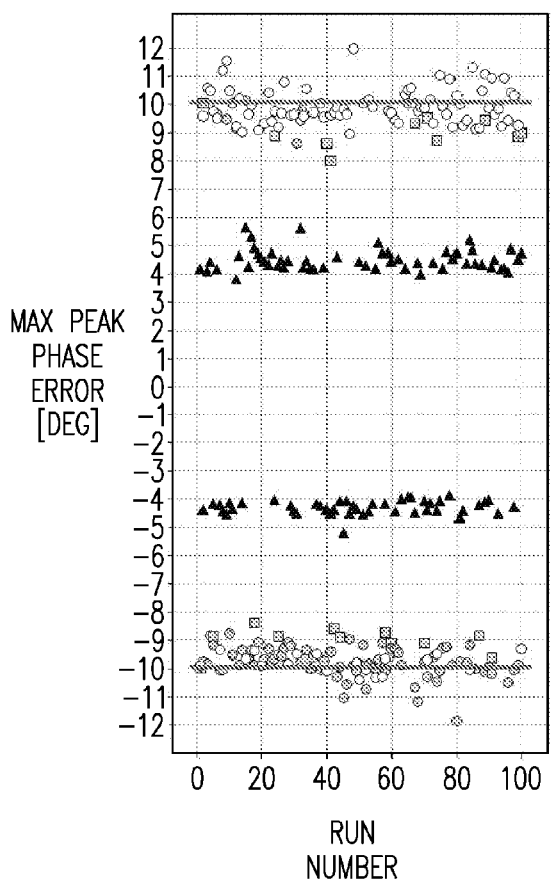
FIG. 22A is a graph illustrating the maximum peak phase error achieved without the use of the mechanism of the present invention.

A graph illustrating the maximum peak phase error achieved without the use of the mechanism of the present invention is shown in FIG. 22A. As in the case of maximum RMS phase error, only the GSM900 case at 85° C. meets the specification for the maximum peak phase error.

Figure 22B:
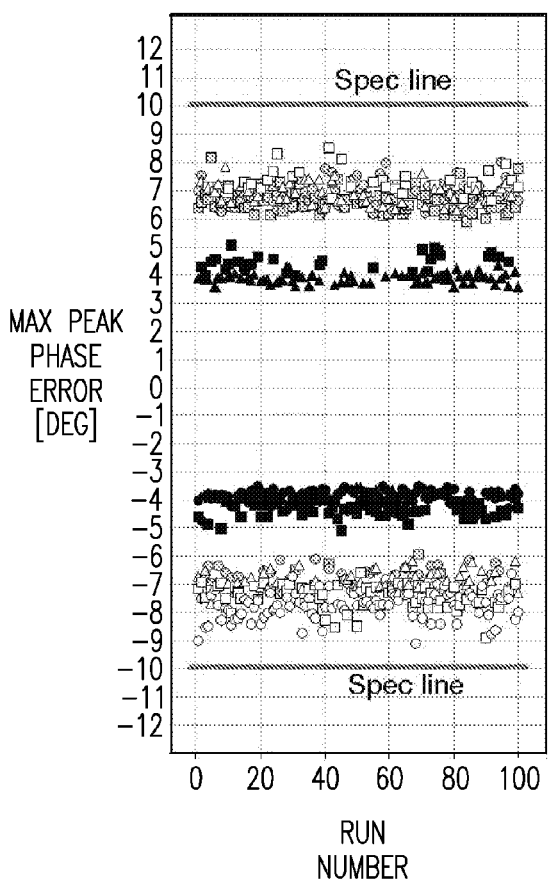
FIG. 22B is a graph illustrating the maximum peak phase error achieved with the use of the mechanism of the present invention.

A graph illustrating the maximum peak phase error achieved with the use of the mechanism of the present invention is shown in FIG. 22B. Use of the dithering mechanism of the present invention enables all test cases to yield maximum peak phase error within that demanded by the specification.

Thus, as shown in the above presented FIGS. 21A, 21B, 22A and 22B, considering a requirement of 3 degrees of permitted RMS phase error and 10 degrees of permitted peak phase error, the circuit without the variable delay slicer mechanism does not meet the specifications. It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. A variable delay buffer, comprising:
   a frequency reference input;
   a differential input circuit coupled to said frequency reference input and operative to generate an output clock signal in accordance thereto; and
   an adjustment circuit coupled to said differential input circuit, said adjustment circuit operative to introduce a controllable mismatch in said differential input circuit thereby introducing a variable delay in said output clock signal;
   wherein said adjustment circuit comprises at least one transistor in parallel with each input transistor of said differential input circuit, wherein the transistors of said adjustment circuit are adapted to be controlled in accordance with a dithering control signal.

2. The buffer according to claim 1, wherein said frequency reference input comprises a single-ended output of an oscillator.

3. The buffer according to claim 1, wherein said frequency reference input comprises a pseudo-differential output of an oscillator.

4. The buffer according to claim 1, wherein said frequency reference input comprises a differential output of an oscillator.

5. The buffer according to claim 1, wherein the operation of said adjustment circuit does not cause substantial degradation of transition times of said output clock signal.

6. The buffer according to claim 1, wherein said adjustment circuit is operative to effectively randomize zero crossings of said frequency reference input such that sensitivity to an interfering signal is reduced.

7. A phase locked loop (PLL), comprising:
   a frequency reference input;
   a buffer coupled to said frequency reference input, said buffer operative to generate a digital output clock signal therefrom, said buffer comprising:
   a differential input circuit coupled to said frequency reference input and operative to generate said output clock signal in accordance thereto;
   an adjustment circuit coupled to said differential input circuit, said adjustment circuit operative to introduce a controllable mismatch in said differential input circuit thereby introducing a variable delay in said output clock signal; and
   a radio frequency (RF) output having a frequency in accordance with the frequency of said output clock signal;
   wherein said adjustment circuit comprises at least one transistor in parallel with each input transistor of said differential input circuit, wherein the transistors of said adjustment circuit are adapted to be controlled in accordance with a dithering control signal.

8. The phase locked loop according to claim 7, wherein the operation of said adjustment circuit does not cause substantial loading change of said frequency reference input.

9. The phase locked loop according to claim 7, wherein said frequency reference input comprises a differential output of a Pierce digitally-controlled crystal oscillator (DCXO).

10. The phase locked loop according to claim 7, wherein said frequency reference input comprises a differential output of an oscillator.

11. The phase locked loop according to claim 7, wherein the operation of said adjustment circuit does not cause substantial degradation of transition times of said output clock signal.

12. The phase locked loop according to claim 7, wherein said adjustment circuit is operative to effectively dither zero crossings of said frequency reference input such that sensitivity to said RF output that is parasitically coupled is reduced.

13. A phase locked loop (PLL), comprising:
a frequency reference input;
a buffer coupled to said frequency reference input, said buffer operative to generate a digital output clock signal therefrom, said buffer comprising:
a differential input circuit coupled to said frequency reference input and operative to generate an output signal in accordance thereto;
a current source coupled to said differential input circuit, said current source operative to bias said differential input circuit;
an adjustment circuit coupled to said current source, said adjustment circuit operative to modify the current generated by said current source thereby introducing a variable delay in said output clock signal; and
a radio frequency (RF) output having a frequency in accordance with the frequency of said output clock signal;
wherein said adjustment circuit comprises a plurality of transistors in parallel to said current source transistors and controlled by a dithering control signal.

14. The phase locked loop according to claim 13, wherein said frequency reference input comprises the differential output of an oscillator.

15. The phase locked loop according to claim 13, wherein the operation of said adjustment circuit does not cause substantial degradation of transition times of said output clock signal.

16. The phase locked loop according to claim 13, wherein said adjustment circuit is operative to effectively dither zero crossings of said frequency reference input such that sensitivity to said RF output that is parasitically coupled is reduced.

* * * * *